(12) United States Patent
Yamanaka

(10) Patent No.: US 8,803,625 B2
(45) Date of Patent: Aug. 12, 2014

(54) SURFACE ACOUSTIC WAVE RESONATOR, SURFACE ACOUSTIC WAVE OSCILLATOR, AND SURFACE ACOUSTIC WAVE MODULE UNIT

(71) Applicant: Seiko Epson Corporation, Tokyo (JP)

(72) Inventor: Kunihito Yamanaka, Kamiina-gun (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/724,469

(22) Filed: Dec. 21, 2012

(65) Prior Publication Data

US 2013/0127554 A1   May 23, 2013

Related U.S. Application Data

(63) Continuation of application No. 13/125,255, filed as application No. PCT/JP2009/005539 on Oct. 22, 2009, now Pat. No. 8,358,177.

(30) Foreign Application Priority Data

Oct. 24, 2008   (JP) ................................ 2008-273969

(51) Int. Cl.
*H03H 9/25* (2006.01)
*H01L 41/04* (2006.01)

(52) U.S. Cl.
USPC ...................................... 331/155; 310/313 A

(58) Field of Classification Search
USPC ................. 331/156, 158, 155; 310/344, 370, 310/313 A; 333/200
See application file for complete search history.

(56) References Cited

U.S. PATENT DOCUMENTS

| | | |
|---|---|---|
| 6,335,584 B1 | 1/2002 | Kadota et al. |
| 6,420,946 B1 | 7/2002 | Bauer et al. |
| 7,002,438 B2 | 2/2006 | Kawachi et al. |
| 7,042,132 B2 | 5/2006 | Bauer et al. |
| 2001/0017578 A1 | 8/2001 | Kadota et al. |
| 2002/0130736 A1 | 9/2002 | Mukai et al. |
| 2004/0090145 A1 | 5/2004 | Bauer et al. |
| 2004/0108918 A1 | 6/2004 | Tsunekawa et al. |
| 2004/0251989 A1 | 12/2004 | Takagi et al. |
| 2009/0108960 A1 | 4/2009 | Igaki et al. |
| 2011/0199160 A1 | 8/2011 | Yamanaka |

FOREIGN PATENT DOCUMENTS

| | | |
|---|---|---|
| JP | A-61-220515 | 9/1986 |
| JP | A-63-135010 | 6/1988 |
| JP | A-03-139008 | 6/1991 |
| JP | A-04-132409 | 5/1992 |
| JP | A-08-023256 | 1/1996 |

(Continued)

*Primary Examiner* — Joseph Chang
(74) *Attorney, Agent, or Firm* — Oliff PLC

(57) ABSTRACT

It is possible to reduce the size of a surface acoustic wave (SAW) resonator by enhancing a Q value. In a SAW resonator in which an IDT having electrode fingers for exciting SAW is disposed on a crystal substrate, the IDT includes a first region disposed at the center of the IDT and a second region and a third region disposed on both sides of the first region. A frequency is fixed in the first region and a portion in which a frequency gradually decreases as it approaches an edge of the IDT is disposed in the second region and the third region. When the frequency of the first region is Fa, the frequency at an edge of the second region is $Fb_M$, and the frequency at an edge of the third region is $Fc_N$, the variations in frequency are in the ranges of $0.9815<Fb_M/Fa<0.9953$ and $0.9815<Fc_N/Fa<0.9953$, respectively.

14 Claims, 23 Drawing Sheets

(56) References Cited

FOREIGN PATENT DOCUMENTS

| | | |
|---|---|---|
| JP | A-10-335966 | 12/1998 |
| JP | B2-3310132 | 7/2002 |
| JP | A-2003-258595 | 9/2003 |
| JP | A-2004-194275 | 7/2004 |
| JP | A-2004-523179 | 7/2004 |
| JP | A-2004-363641 | 12/2004 |
| JP | A-2005-204042 | 7/2005 |
| JP | B2-4017984 | 12/2007 |
| WO | WO 03/003574 A1 | 1/2003 |
| WO | WO 2005/067141 A1 | 7/2005 |
| WO | WO 2010/047112 A1 | 4/2010 |

| TOTAL NUMBER OF PAIRS | NUMBER OF PAIRS IN LEFT REFLECTOR | NUMBER OF PAIRS IN IDT | NUMBER OF PAIRS IN RIGHT REFLECTOR |
|---|---|---|---|
| 100 | 0 | 100 | 0 |
| 110 | 5 | 100 | 5 |
| 120 | 10 | 100 | 10 |
| 130 | 15 | 100 | 15 |
| 140 | 20 | 100 | 20 |
| 150 | 25 | 100 | 25 |
| 160 | 30 | 100 | 30 |
| 170 | 35 | 100 | 35 |
| 180 | 40 | 100 | 40 |
| 190 | 45 | 100 | 45 |
| 200 | 50 | 100 | 50 |

| VARIATION IN ELECTRODE FINGER PITCH (%) | $Pb_M/Pa, Pc_N/Pa$ | $Fb_M/Fa, Fc_N/Fa$ |
|---|---|---|
| 0.47 | 1.0047 | 0.9953 |
| 0.72 | 1.0072 | 0.9929 |
| 0.81 | 1.0081 | 0.9920 |
| 1.37 | 1.0137 | 0.9865 |
| 1.49 | 1.0149 | 0.9853 |
| 1.88 | 1.0188 | 0.9815 |
| 3.02 | 1.0302 | 0.9707 |

| TOTAL NUMBER OF PAIRS | NUMBER OF PAIRS IN LEFT REFLECTOR | NUMBER OF PAIRS IN IDT | NUMBER OF PAIRS IN RIGHT REFLECTOR |
|---|---|---|---|
| 100 | 5 | 100 | 5 |
| 130 | 15 | 100 | 15 |
| 150 | 25 | 100 | 25 |
| 170 | 35 | 100 | 35 |
| 190 | 45 | 100 | 45 |
| 200 | 50 | 100 | 50 |

SURFACE ACOUSTIC WAVE RESONATOR, SURFACE ACOUSTIC WAVE OSCILLATOR, AND SURFACE ACOUSTIC WAVE MODULE UNIT

This is a Continuation of application Ser. No. 13/125,255, filed Apr. 20, 2011, which is a National Phase of Application No. PCT/JP2009/005539, filed Oct. 22, 2009, which claims benefit to Japanese Application No. 2008-273969, filed Oct. 24, 2008, the disclosures of which is hereby incorporated by referenced in its entirety.

TECHNICAL FIELD

The present invention relates to a surface acoustic wave resonator employing a piezoelectric substrate, a surface acoustic wave oscillator, and a surface acoustic wave module unit.

BACKGROUND ART

Conventionally, surface acoustic wave resonators using surface acoustic waves (SAW) have been widely used in electronic apparatuses.

With the recent spread of portable devices, there has been a demand for a decrease in the size of surface acoustic wave resonators used therein. When the number of pairs of electrode fingers in an IDT (Interdigital Transducer) including a comb-like electrode decreases so as to reduce the size of the surface acoustic wave resonator, there is a problem in that a decrease in Q value or an increase in CI (Crystal Impedance) value is caused and thus the characteristics of the surface acoustic wave resonator cannot be satisfactorily obtained.

As a countermeasure, for example, PTL 1 discloses a surface acoustic wave resonator in which an IDT including alternately arranged electrode fingers is divided into three regions and the electrode fingers in each region of the IDT are arranged with a fixed periodic length varying within 2%. According to this configuration, it is possible to enhance the Q value and thus to reduce the size of the surface acoustic wave resonator.

PTL 2 discloses an IDT which is formed with a structure in which the distance between the centers of two neighboring electrode finger (electrode fingers) in the IDT varies throughout the entire length of the IDT, thereby obtaining an excellent degree of electrical coupling.

CITATION LIST

Patent Literature

[PTL 1] JP-A-2004-194275
[PTL 2] JP-A-2004-523179

SUMMARY OF THE INVENTION

Technical Problem

However, in PTL 1, since a boundary between the regions in the IDT serves as a discontinuous part of the periodic length, a part of the surface acoustic waves are mode-converted into bulk waves. The bulk waves are radiated into the substrate and thus the Q value of resonance based on the surface acoustic waves is lowered. In this way, the technique described in PTL 1 does not provide a configuration for efficiently improving the Q value.

In PTL 2, the electrode finger pitch varies throughout the entire length of the IDT to obtain an excellent degree of electrical coupling, but the enhancement in the Q value is not optimized.

Solution to Problem

The invention is made to solve at least a part of the above-mentioned problems and can be embodied by the following aspects or applications.

(Application 1) According to an aspect of the invention, there is a provided a surface acoustic wave resonator in which an IDT having electrode fingers for exciting surface acoustic waves is disposed on a piezoelectric substrate, wherein the IDT includes a first region disposed at the center of the IDT and a second region and a third region disposed on both sides of the first region and where a frequency is fixed in the first region and a portion in which a frequency gradually decreases as it approaches the edge of the IDT from a part adjacent to the first region is disposed in the second region and the third region. Here, when the frequency of the first region is Fa, the frequency at an edge of the second region on the opposite side of the first region is $Fb_M$, and the frequency at an edge of the third region on the opposite side of the first region is $Fc_N$, the variations in frequency at the edges are in the ranges of $0.9815<Fb_M/Fa<0.9953$ and $0.9815<Fc_N/Fa<0.9953$, respectively.

According to this configuration, the IDT includes the first region disposed at the center thereof and the second region and the third region disposed on both sides of the first region. The frequency in the first region is fixed. The second region and the third region each include a portion in which the frequency gradually decreases as it approaches the edges. That is, the IDT is weighted using the frequency.

That is, in the first region having a large vibration displacement, the superposition of reflected waves due to the phase difference between the reflected waves of surface acoustic waves is emphasized and the frequency in the region is set to be fixed. In the second region and the third region having a small vibration displacement, in spite of the sacrifice of the matching in phase between the reflected waves, plural (preferably a high number) portions in which the frequency gradually decreases are formed, thereby causing the reflection of surface acoustic waves in the central portion of the IDT due to the frequency difference at plural positions (preferably a high number of positions).

In the first region at the center of the IDT, since the reflected waves are superposed with a small phase difference due to this weighting, the vibration displacement is maintained to be great. Since the reflection of surface acoustic waves to the first region from the second region and the third region can be enhanced, it is possible to enhance the confinement of vibration energy in the IDT, thereby improving the Q value.

By setting the ratios ($Fb_M/Fa$ and $Fc_N/Fa$) of the frequency $Fb_M$ at the edge of the second region and the frequency $Fc_N$ at the edge of the third region to the frequency Fa in the first region to the above-mentioned ranges, it is possible to improve the Q value in comparison with the conventional surface acoustic wave resonator, thereby reducing the size of the surface acoustic wave resonator.

(Application 2) In the surface acoustic wave resonator, the variations in frequency may be in the ranges of $0.9865 \leq Fb_M/Fa \leq 0.9920$ and $0.9865 \leq Fc_N/Fa \leq 0.9920$, respectively.

By setting the ratios ($Fb_M/Fa$ and $Fc_N/Fa$) of the frequency $Fb_S$ at the edge of the second region and the frequency $Fc_N$ at the edge of the third region to the frequency Fa in the first region to the above-mentioned ranges, it is possible to greatly improve the Q value in comparison with the conventional surface acoustic wave resonator, thereby further reducing the size of the surface acoustic wave resonator.

(Application 3) In the surface acoustic wave resonator, when the frequency at a position in the second region is $Fb_m$, the frequency at a position adjacent thereto is $Fb_{m+1}$, the frequency at a position in the third region is $Fc_n$, and the frequency at a position adjacent thereto is $Fc_{n+1}$, the variations in frequency at neighboring positions in the portion in which the frequency gradually decreases may be in the ranges of $0<|Fb_{m+1}-Fb_m|/Fb_m<0.000225$ and $0<|Fc_{n+1}-Fc_n|/Fc_n<0.000225$, respectively.

According to this configuration, by setting the variations in frequency ($|Fb_{m+1}-Fb_m|/Fb_m$ and $<|Fc_{n+1}-Fc_n|/Fc_n$) at the neighboring positions of the second region and the third region of the IDT to the above-mentioned ranges, it is possible to improve the Q value in comparison with the conventional surface acoustic wave resonator, thereby reducing the size of the surface acoustic wave resonator.

(Application 4) In the surface acoustic wave resonator, an electrode finger pitch between centers of two neighboring electrode fingers in the first region may be fixed, the electrode finger pitch in the second region may be set to be greater than the electrode finger pitch in the first region and to gradually increase from a part adjacent to the first region to an edge of the IDT, and the electrode finger pitch in the third region may be set to be greater than the electrode finger pitch in the first region and to gradually increase from a part adjacent to the first region to the other edge of the IDT. Here, when the electrode finger pitch in the first region is Pa, the electrode finger pitch at the edge of the second region is $Pb_M$, and the electrode finger pitch at the edge of the third region is $Pc_N$, the variations in electrode finger pitch at the edges may be in the ranges of $1.0047<Pb_M/Pa<1.0188$ and $1.0047<Pc_N/Pa<1.0188$, respectively.

According to this configuration, by varying the electrode finger pitch as the weighting of the IDT using the frequency, the frequency is varied. The electrode finger pitch in the first region is fixed and the electrode finger pitch in the second region and the third region gradually increases from the parts adjacent to the first region to the edges of the IDT. By this weighting, since the vibration displacement in the first region at the center of the IDT can be maintained to be great and the reflection of surface acoustic waves in the second region and the third region on both sides thereof can be made to increase, it is possible to enhance the confinement of vibration energy in the IDT, thereby enhancing the Q value.

By setting the ratios ($Pb_M/Pa$ and $Pc_N/Pa$) of the electrode finger pitch $Pb_M$ at the edge of the second region and the electrode finger pitch $Pc_N$ at the edge of the third region to the electrode finger pitch Pa in the first region to the above-mentioned ranges, it is possible to improve the Q value in comparison with the conventional surface acoustic wave resonator, thereby reducing the size of the surface acoustic wave resonator.

(Application 5) In the surface acoustic wave resonator, the variations in electrode finger pitch at the edges may be in the ranges of $1.0081 \leq Pb_M/Pa \leq 1.0137$ and $1.0081 \leq Pc_N/Pa \leq 1.0137$, respectively.

By setting the ratios ($Pb_M/Pa$ and $Pc_N/Pa$) of the electrode finger pitch $Pb_M$ at the edge of the second region and the electrode finger pitch $Pc_N$ at the edge of the third region to the electrode finger pitch Pa in the first region to the above-mentioned ranges, it is possible to greatly improve the Q value in comparison with the conventional surface acoustic wave resonator, thereby further reducing the size of the surface acoustic wave resonator.

(Application 6) In the surface acoustic wave resonator, when the electrode finger pitch at a position in the second region is $Pb_m$, the electrode finger pitch at a position adjacent thereto is $Pb_{m+1}$, the electrode finger pitch at a position in the third region is $Pc_n$, and the electrode finger pitch at a position adjacent thereto is $Pc_{n+1}$, the variations in electrode finger pitch at neighboring positions may be in the ranges of $0<|Pb_{m+1}-Pb_m|/Pb_m<0.000225$ and $0<|Pc_{n+1}-Pc_n|/Pc_n<0.000225$, respectively.

According to this configuration, by setting the variations in electrode finger pitch ($|Pb_{m+1}-Pb_m|/Pb_m$ and $<Pc_{n+1}-Pc_n|/Pc_n$) at the neighboring positions of the second region and the third region of the IDT to the above-mentioned ranges, it is possible to improve the Q value in comparison with the conventional surface acoustic wave resonator, thereby reducing the size of the surface acoustic wave resonator.

(Application 7) In the surface acoustic wave resonator, when the number of pairs of electrode fingers in the IDT is Ni and the number of pairs of electrode fingers in the first region of the IDT is Na, the number of pairs of electrode fingers Na in the first region may be two or more and the numbers of pairs of electrode fingers may satisfy $Na/Ni \leq 0.312$.

According to this configuration, by setting the ratio (Na/Ni) of the number of pairs of electrode fingers Na in the first region to the number of pairs of electrode fingers Ni in the IDT to the above-mentioned range, it is possible to improve the Q value in comparison with the conventional surface acoustic wave resonator, thereby reducing the size of the surface acoustic wave resonator.

(Application 8) In the surface acoustic wave resonator, the numbers of pairs of electrode fingers may satisfy $0.111 \leq Na/Ni \leq 0.285$.

According to this configuration, by setting the ratio (Na/Ni) of the number of pairs of electrode fingers Na in the first region to the number of pairs of electrode fingers Ni in the IDT to the above-mentioned range, it is possible to greatly improve the Q value in comparison with the conventional surface acoustic wave resonator, thereby further reducing the size of the surface acoustic wave resonator.

(Application 9) In the surface acoustic wave resonator, reflectors may be disposed on both sides of the IDT. In this case, when the number of pairs of electrode fingers in the reflector disposed on one side of the IDT is Nr1 and the number of pairs of electrode fingers in the reflector disposed on the other side of the IDT is Nr2, the numbers of pairs of electrode fingers may satisfy $Na/(Ni+Nr1+Nr2) \leq 0.24$.

According to this configuration, by setting the ratio (Na/(Ni+Nr1+Nr2)) of the number of pairs of electrode fingers Na in the first region to the sum of the number of pairs of electrode fingers Ni in the IDT and the number of pairs of electrode fingers Nr in the reflectors to the above-mentioned range, it is possible to greatly improve the Q value in comparison with the conventional surface acoustic wave resonator, thereby further reducing the size of the surface acoustic wave resonator.

(Application 10) In the surface acoustic wave resonator, the numbers of pairs of electrode fingers may satisfy $0.088 \leq Na/(Ni+Nr1+Nr2) \leq 0.219$.

According to this configuration, by setting the ratio (Na/(Ni+Nr1+Nr2)) of the number of pairs of electrode fingers Na in the first region to the sum of the number of pairs of electrode fingers Ni in the IDT and the number of pairs of electrode fingers Nr in the reflectors to the above-mentioned range, it is possible to greatly improve the Q value in comparison with the conventional surface acoustic wave resonator, thereby further reducing the size of the surface acoustic wave resonator.

(Application 11) In the surface acoustic wave resonator, when a value obtained by dividing the width of each electrode finger by an electrode finger pitch which is the distance between the centers of the neighboring electrode fingers is defined as a line occupying ratio, the line occupying ratio in the first region may be fixed, the line occupying ratio in the second region may be set to be greater than the line occupying ratio in the first region and to gradually increase from a part adjacent to the first region to an edge of the IDT, and the line occupying ratio in the third region may be set to be greater than the line occupying ratio in the first region and to gradually increase from a part adjacent to the first region to the other edge of the IDT. Here, when the line occupying ratio in the first region is $\eta a$, the line occupying ratio at the edge of the second region on the opposite side of the first region is $\eta b_M$, and the line occupying ratio at the edge of the third region on the opposite side of the first region is $\eta c_N$, the variations in line occupying ratio at the edges may be in the ranges of $1.15 < \eta b_M / \eta a < 1.70$ and $1.15 < \eta c_N / \eta a < 1.70$, respectively.

According to this configuration, by varying the line occupying ratio as the weighting of the IDT using the frequency, the frequency is varied. The line occupying ratio in the first region is fixed and the line occupying ratio in the second region and the third region gradually increases from the parts adjacent to the first region to the edges of the IDT. By this weighting, since the vibration displacement in the first region at the center of the IDT is maintained to be great, the vibration displacement in the second and third regions at the edges of the IDT is small, and the reflection of surface acoustic waves in the second region and the third region at both edges of the IDT can be made to increase, it is possible to enhance the confinement of vibration energy in the IDT, thereby enhancing the Q value.

By setting the ratios ($\eta b_M / \eta a$ and $\eta c_N / \eta a$) of the line occupying ratio $\eta b_M$ at the edge of the second region and the line occupying ratio $\eta c_N$ at the edge of the third region to the line occupying ratio $\eta a$ in the first region to the above-mentioned ranges, it is possible to improve the Q value in comparison with the conventional surface acoustic wave resonator, thereby reducing the size of the surface acoustic wave resonator.

(Application 12) In the surface acoustic wave resonator, when the line occupying ratio at a position in the second region is $\eta b_m$, the line occupying ratio at a position adjacent thereto is $\eta b_{m+1}$, the line occupying ratio at a position in the third region is $\eta c_n$, and the line occupying ratio at a position adjacent thereto is $\eta c_{n+1}$, the variations in line occupying ratio at neighboring positions may be in the ranges of $0.0018 < |\eta b_{m+1} - \eta b_m| / \eta b_m < 0.00885$ and $0.0018 < |\eta c_{n+1} - \eta c_n| / \eta c_n < 0.00885$, respectively.

According to this configuration, by setting the variations in line occupying ratio ($|\eta b_{m+1} - \eta b_m| / \eta b_m$ and $< |\eta c_{n+1} - \eta c_n| / \eta c_n$) at the neighboring positions of the second region and the third region of the IDT to the above-mentioned ranges, it is possible to improve the Q value in comparison with the conventional surface acoustic wave resonator, thereby reducing the size of the surface acoustic wave resonator.

(Application 13) In the surface acoustic wave resonator, the piezoelectric substrate may be a crystal substrate.

According to this configuration, since a crystal substrate is used as the piezoelectric substrate, it is possible to obtain a surface acoustic wave resonator with an excellent frequency-temperature characteristic.

(Application 14) According to another aspect of the invention, there is provided a surface acoustic wave oscillator in which the above-mentioned surface acoustic wave resonator and a circuit element are mounted on a package.

According to this configuration, since the surface acoustic wave resonator having the enhanced Q value and the reduced size is mounted, it is possible to provide a surface acoustic wave oscillator having a small size.

(Application 15) According to still another aspect of the invention, there is provided a surface acoustic wave module unit in which the above-mentioned surface acoustic wave resonator is mounted on a circuit board.

According to this configuration, since the surface acoustic wave resonator having the enhanced Q value and the reduced size is mounted, it is possible to provide a surface acoustic wave module unit having a small size.

DESCRIPTION OF EMBODIMENTS

Figure 1:
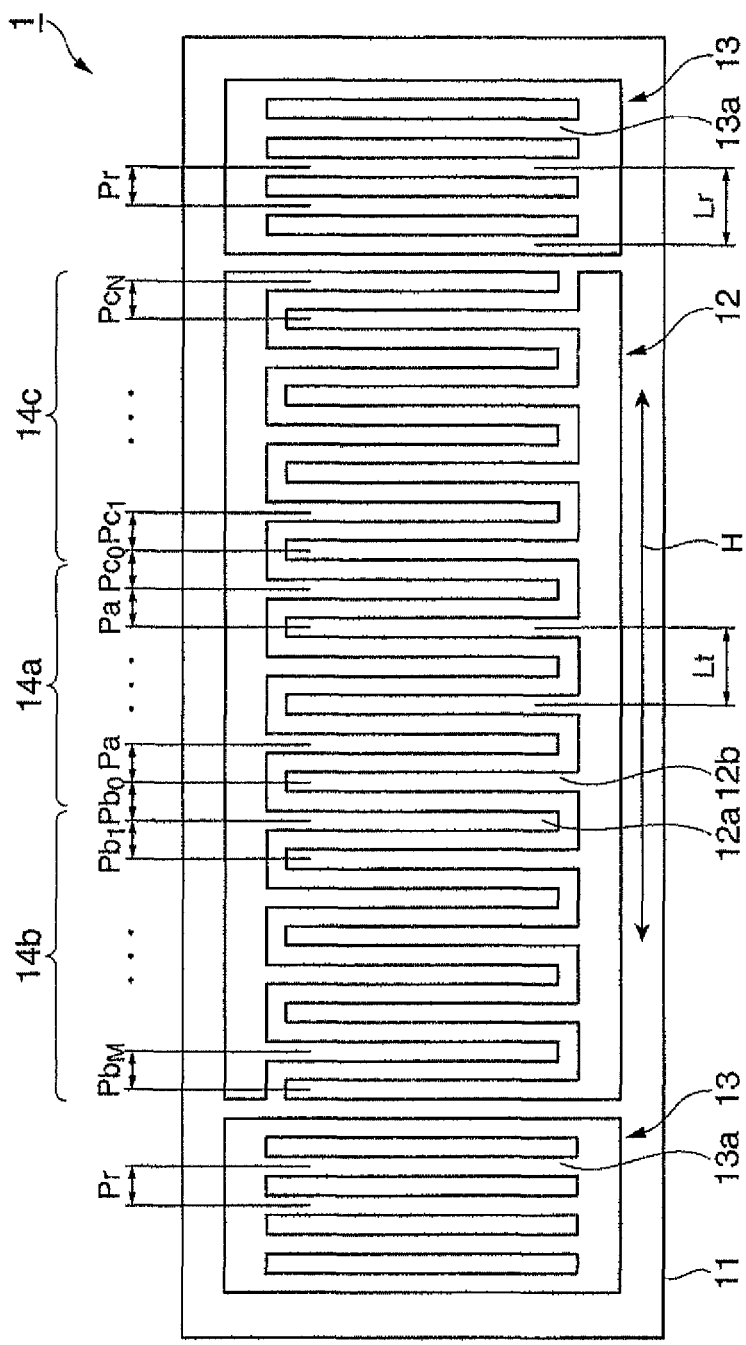
FIG. 1 is a plan view schematically illustrating the configuration of a surface acoustic wave resonator according to a first embodiment of the invention.

Hereinafter, exemplary embodiments of the invention will be described with reference to the accompanying drawings. In the drawings described below, the size scales of constituent elements are appropriately changed to facilitate recognition of the constituent elements.

(Surface Acoustic Wave Resonator as Comparative Example)

First, a surface acoustic wave resonator as a comparative example will be described for the purpose of easy understanding of the invention and comparison with the embodiments.

Figure 39:
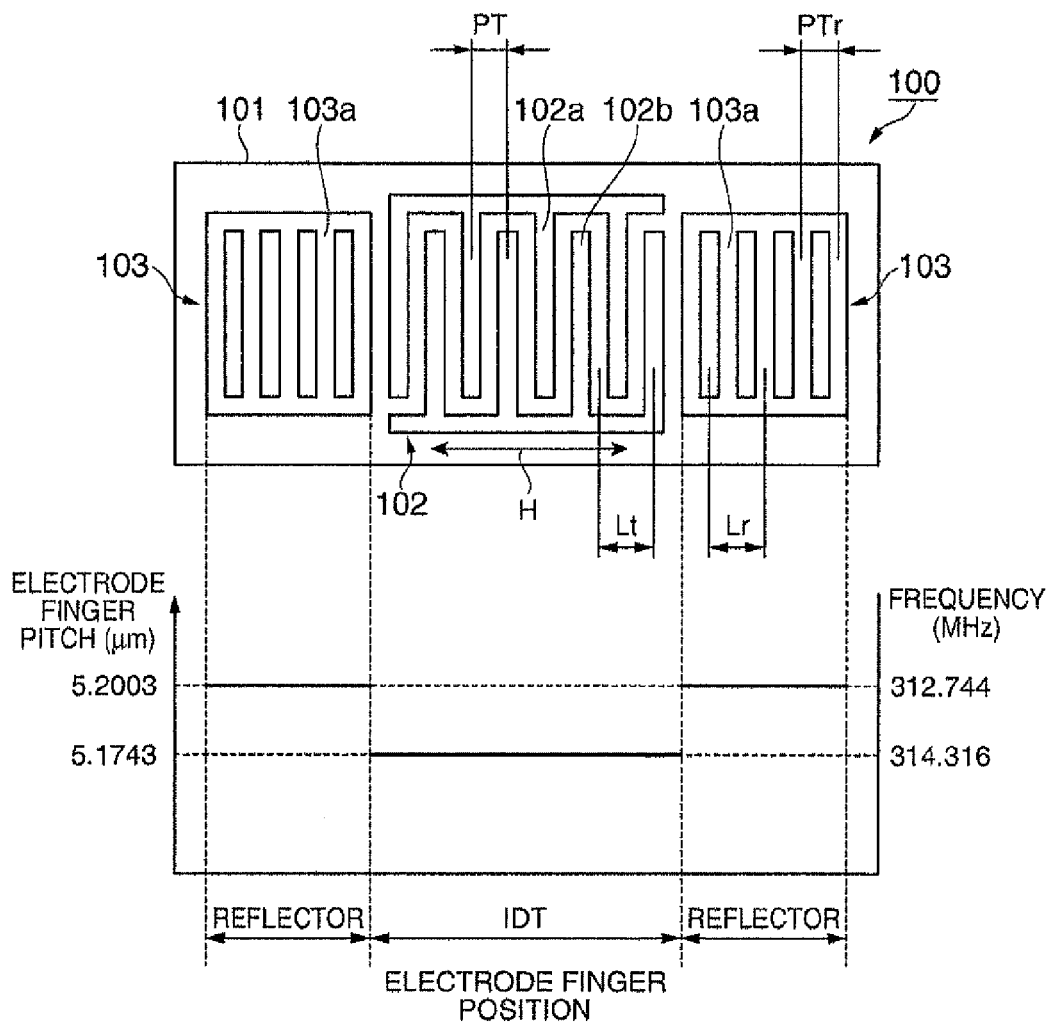
FIG. 39 is a diagram schematically illustrating a conventional surface acoustic wave resonator.

FIG. 39 is a diagram schematically illustrating a conventional surface acoustic wave resonator.

The surface acoustic wave resonator 100 includes an IDT 102 having a comb-like electrode and a pair of reflectors 103 disposed with the IDT 102 interposed therebetween in the direction (the direction of arrow H) in which surface acoustic waves travel, on a crystal substrate 101 as a piezoelectric substrate.

The crystal substrate 101 is a crystal substrate with an Euler angle (0°, 38°, 90°) when a cut face and a surface acoustic wave traveling direction are expressed by an Euler angle ($\phi$, $\theta$, $\psi$).

In the IDT 102, electrode fingers 102a and 102b having different electrical polarities are alternately arranged. Two electrode fingers 102a and 102b are called a pair of electrode fingers.

The electrode finger pitch PT which is a distance between the centers of neighboring electrode fingers 102a and 102b is uniform in the IDT 102.

In the reflectors 103, plural electrode fingers 103a are arranged to be electrically neutral. The electrode finger pitch PTr which is a distance between the centers of neighboring electrode fingers 103a is also uniform in the reflectors 103.

Figure 40:
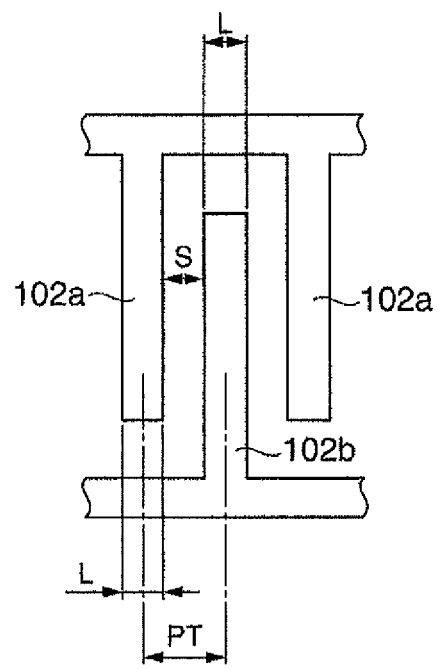
FIG. 40 is a diagram schematically illustrating the line occupying ratio.

Here, a ratio at which the electrode fingers occupy the IDT 102 and the reflectors 103 in the surface acoustic waves traveling direction is referred to as a line occupying ratio $\eta$. Specifically, as shown in FIG. 40, when the line width of the electrode fingers 102a and 102b is defined as L, the distance between neighboring electrode fingers (a space in which the electrode fingers are not formed) is defined as S, and the electrode finger pitch of the neighboring electrode fingers is defined as PT, the electrode finger pitch is expressed by PT=S+(L/2+L/2) and a line occupying ratio is expressed by $\eta$=(L/2+L/2)/PT=L/PT. The line occupying ratio $\eta$ is set to 0.5.

The IDT 102 and the reflectors 103 are formed of a metal material such as aluminum (Al) and are set to a predetermined thickness (=0.06$\lambda$, where $\lambda$ is a wavelength of the surface acoustic waves). The line width of the electrode fingers is set to 0.25$\lambda$. The number of pairs of electrode fingers in the IDT 102 is set to 100 and the number of pairs of electrode fingers in each of the reflectors 103 is set to 15 (30 pairs) (130 pairs in total). The electrode finger pitch of the IDT 102 is set to 5.1743 μm and the frequency is set to 314.316 MHz. The electrode finger pitch PTr of the reflectors 103 is set to 5.2003 μm.

In such a surface acoustic wave resonator 100, SH (Shear Horizontal) waves are excited by the IDT 102 and the Q value as a characteristic thereof is 10,600.

In the surface acoustic wave resonator 100 having the above-mentioned configuration, the Q value varies depending on the number of pairs of electrode fingers in the IDT 102 and the reflectors 103.

Figure 41:
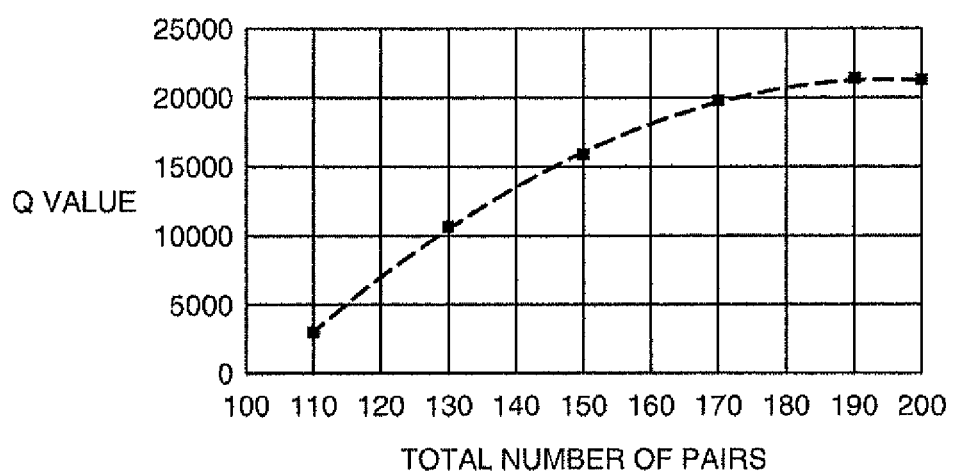
FIG. 41 is a graph illustrating the relation between the sum of (the total number of) pairs of electrode fingers and the Q value in the IDT and the reflectors.
Figures 42, 43:
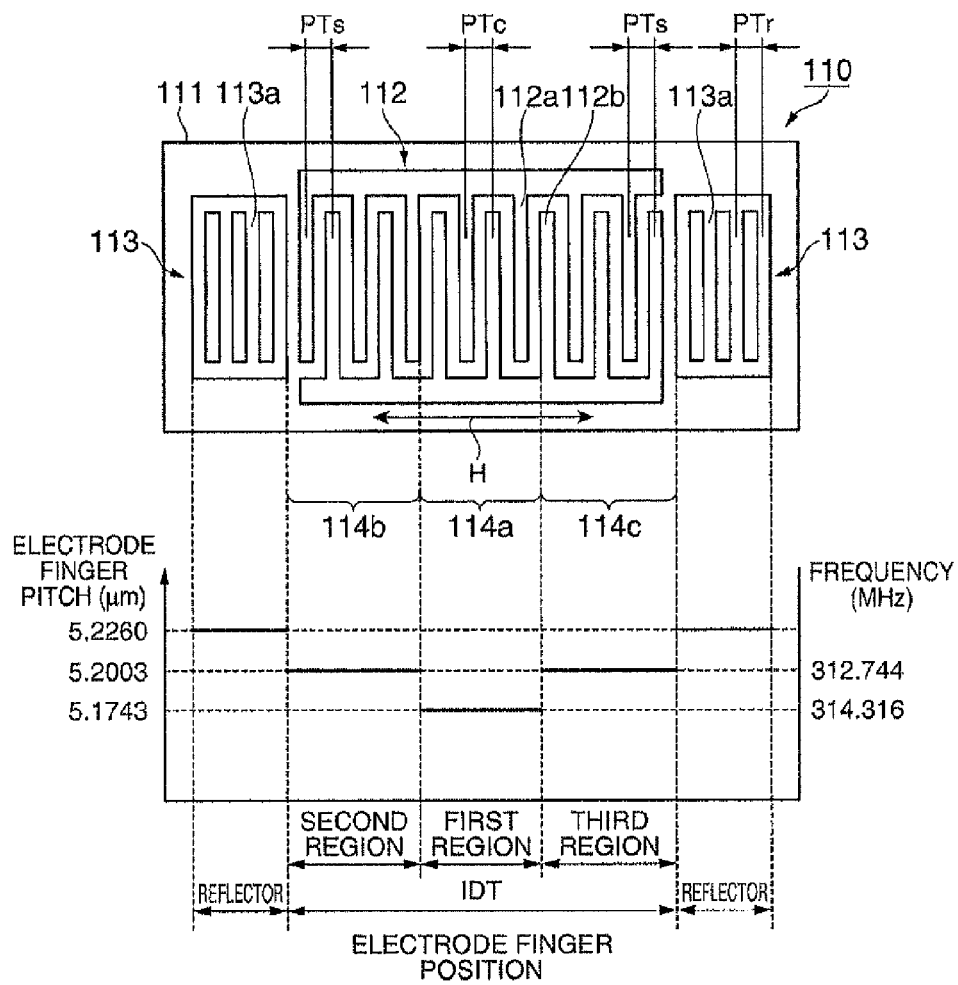
FIG. 42 is a table illustrating details of the numbers of pairs of electrode fingers in the IDT and the reflectors with respect to the total number of pairs of electrode fingers.
FIG. 43 is a diagram schematically illustrating another conventional surface acoustic wave resonator.

FIG. 41 is a graph illustrating the relation between the sum of (the total number of) pairs of electrode fingers in the IDT and the reflectors. FIG. 42 is a table illustrating details of the numbers of pairs of electrode fingers in the IDT and the reflectors with respect to the total number of pairs of electrode fingers shown in FIG. 41.

Regarding the total number of pairs, as shown in FIG. 42, the Q value is calculated when the number of pairs of electrode fingers in the IDT is fixed to 100 pairs and the numbers of pairs of electrode fingers in the right and left reflectors are changed.

As shown in FIG. 41, the Q value increases as the total number of pairs of electrode fingers increases. When the total number of pairs of electrode fingers is in the range of 110 to 170 pairs of electrode fingers, the Q value also increases with the increase in the number of pairs of electrode fingers. However, when the total number of pairs of electrode fingers is greater than 170, the increase in the Q value is reduced and approaches the saturated state with the increase in the number of pairs of electrode fingers.

In this way, the Q value can be enhanced by increasing the total number of pairs of electrode fingers, but the increase in the number of pairs of electrode fingers causes the increase in the size of the surface acoustic wave resonator, which is not consistent with the decrease in the size of the surface acoustic wave resonator. Regarding the decrease in the size of the surface acoustic wave resonator, it is necessary to enhance the Q value by the smallest total number of pairs of electrode fingers.

Another surface acoustic wave resonator will be described below.

FIG. 43 is a diagram schematically illustrating a surface acoustic wave resonator described in JP-A-2004-194275.

A surface acoustic wave resonator 110 includes an IDT 112 and a pair of reflectors 113 formed in the surface acoustic wave traveling direction on a crystal substrate 111 as a piezoelectric substrate.

The invention described in JP-A-2004-194275 does not disclose a specific configuration for SH waves. Accordingly, for the purpose of comparison with the invention, design conditions for efficiently exciting SH waves were obtained by simulation and trial production based on the invention described in JP-A-2004-194275 and the Q value as a characteristic of the surface acoustic wave resonator was measured.

When a cut face and a surface acoustic wave traveling direction are expressed by an Euler angle ($\phi$, $\theta$, $\psi$) the crystal substrate 111 is a crystal substrate with an Euler angle of (0°, 38°, 90°).

The IDT 112 is divided into three regions of a first region 114a at the center thereof and a second region 114b and a third region 114c on both sides thereof. Here, the distance between the center lines of neighboring electrode fingers 112a and 112b is defined as an electrode finger pitch PT. In each region, the electrode finger pitch PT is fixed, but the electrode finger pitch PT varies depending on the regions. When the electrode finger pitch in the first region 114a is PTc and the electrode finger pitch in the second region 114b and the third region 114c is PTs, a relational expression PTc<PTs is established.

In the reflectors 113, plural electrode fingers 113a are arranged to be electrically neutral. When the electrode finger pitch which is the distance between the centers of the neighboring electrode fingers 113a is PTr, a relational expression PTc<PTs<PTr is established.

The surface acoustic waves excited by the IDT 112 travel in the direction of arrow H and travels in the direction intersecting the electrode fingers 112a and 112b.

The IDT 112 and the reflectors 113 are formed of a metal material such as aluminum (Al) and are set to a predetermined thickness (=0.06$\lambda$, where $\lambda$ is a wavelength of the surface acoustic waves). The number of pairs of electrode fingers in the IDT 112 is set to 100, where 20 pairs of electrode fingers are set for the first region 114a and 40 pairs of electrode fingers are set for each of the second region 114b and the third region 114c. The number of pairs of electrode fingers in each of the reflectors 113 is set to 15. Accordingly, 130 pairs of electrode fingers in total are arranged in the surface acoustic wave resonator 110.

The electrode finger pitch in the IDT 112 is set to PTc=5.1743 µm in the first region 114a and PTs=5.2003 µm in the second region 114b and the third region 114c. The frequency is set to 314.316 MHz in the first region 114a and 312.744 MHz in the second region 114b and the third region 114c. The electrode finger pitch PTr in the reflectors 113 is set to 5.2260 µm. The line occupying ratio $\eta$ is set to 0.5.

In such a surface acoustic wave resonator 110, SH (Shear Horizontal) waves are excited by the IDT 112 and the Q value as a characteristic thereof is 12,700.

First Embodiment

A surface acoustic wave resonator according to a first embodiment of the invention will be described below.

Figure 2:
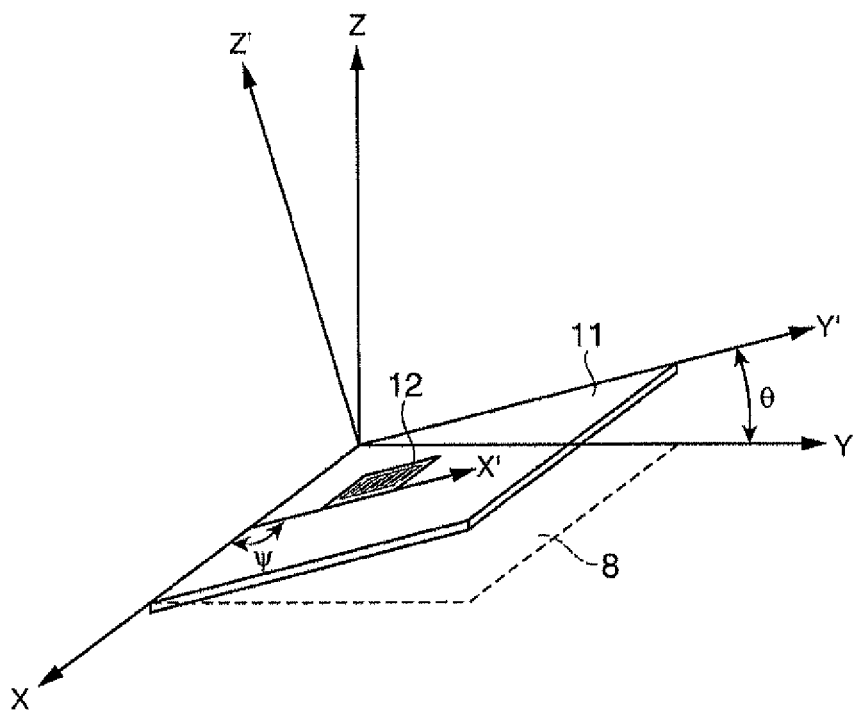
FIG. 2 is a diagram illustrating a cutout angle of a crystal substrate and a traveling direction of surface acoustic waves.
Figure 3:
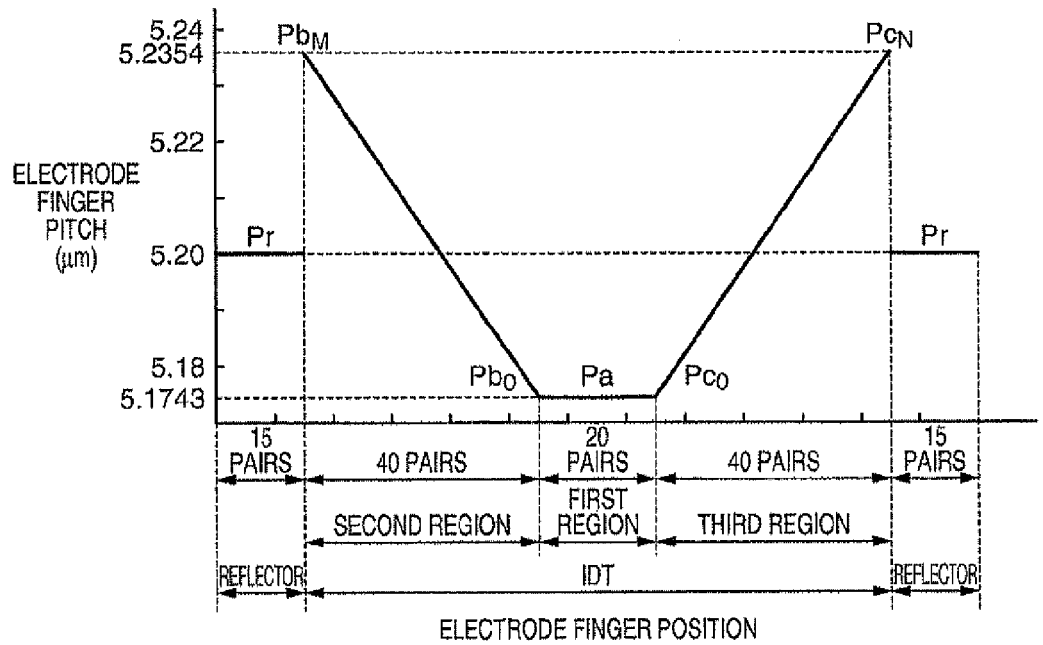
FIG. 3 is a diagram illustrating the relation between an electrode finger position and an electrode finger pitch in the surface acoustic wave resonator according to the first embodiment.
Figure 4:
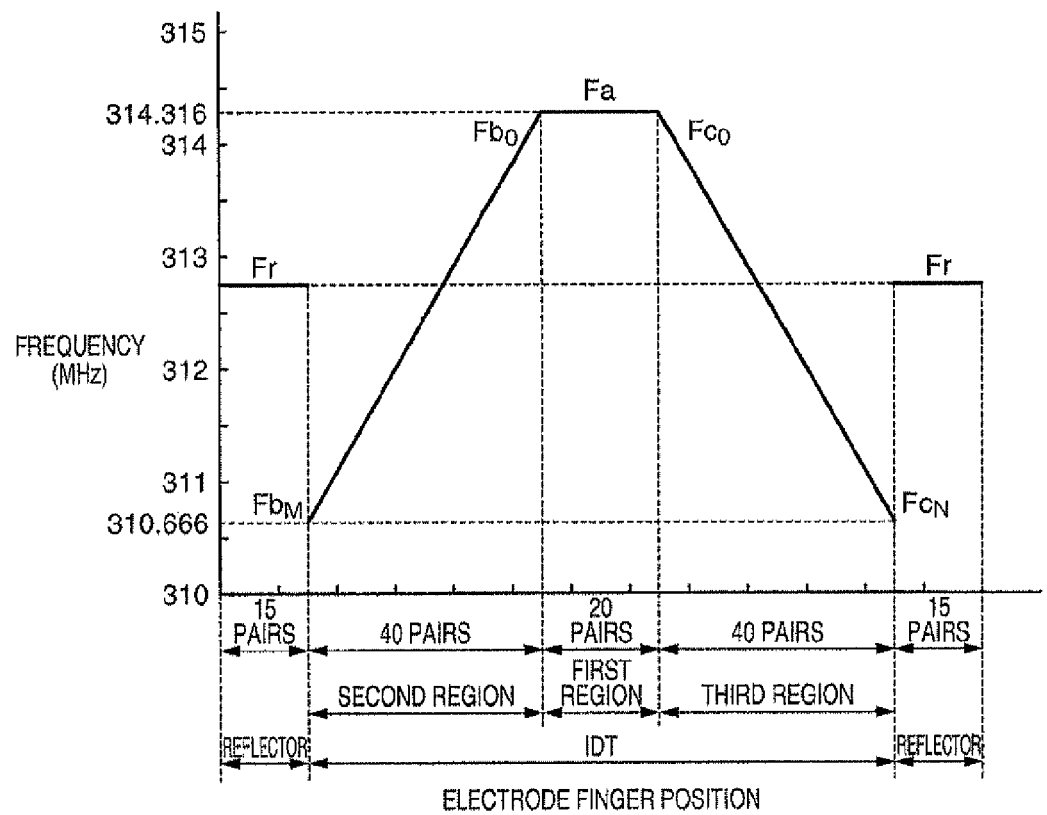
FIG. 4 is a diagram illustrating the relation between the electrode finger position and the frequency in the surface acoustic wave resonator according to the first embodiment.
Figure 5:
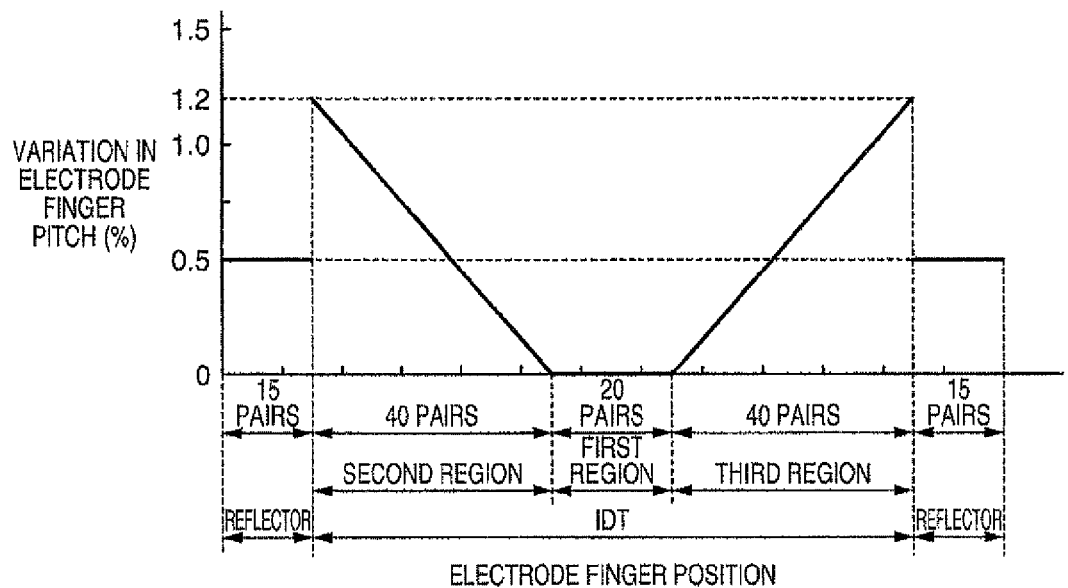
FIG. 5 is a diagram illustrating the relation between the electrode finger position and a variation in electrode finger pitch in the surface acoustic wave resonator according to the first embodiment.

FIG. 1 is a plan view schematically illustrating the configuration of a surface acoustic wave resonator according to a first embodiment of the invention. FIG. 2 is a diagram illustrating a cutout angle of a crystal substrate and a traveling direction of surface acoustic waves. FIG. 3 is a diagram illustrating the relation between an electrode finger position and an electrode finger pitch in the surface acoustic wave resonator according to the first embodiment. FIG. 4 is a diagram illustrating the relation between the electrode finger position and the frequency in the surface acoustic wave resonator according to the first embodiment. FIG. 5 is a diagram illustrating the relation between the electrode finger position and a variation in electrode finger pitch in the surface acoustic wave resonator according to the first embodiment.

As shown in FIG. 1, the surface acoustic wave resonator 1 includes an IDT 12 having a comb-like electrode and a pair of reflectors 13 disposed with the IDT 12 interposed therebetween in the direction in which surface acoustic waves travel, on a crystal substrate 11 as a piezoelectric substrate.

When a cut face and a surface acoustic wave traveling direction are expressed by the Euler angle ($\phi$, $\theta$, $\psi$), the crystal substrate 11 is a crystal substrate with an Euler angle of (−1° to +1°, 26° to 40.7°, 85° to 95°).

As shown in FIG. 2, crystal axes of the crystal are defined by an X axis (electrical axis), a Y axis (mechanical axis), and a Z axis (optical axis), and the Euler angle (0°, 0°, 0°) is a crystal Z plate 8 perpendicular to the Z axis. Here, the Euler angle $\phi$ (not shown) is related to a first rotation of the crystal Z plate 8, and represents a first rotation angle in which the Z axis is set as a rotation axis and a rotating direction from the +X axis to the +Y axis is defined as a positive rotating direction. The Euler angle $\theta$ is related to a second rotation performed after the first rotation of the crystal Z plate 8, and represents a second rotation angle in which the X axis after the first rotation is set as a rotation axis and a rotating direction from the +Y axis after the first rotation to the +Z axis is defined as a positive rotating direction. The cut face of the crystal substrate 11 is determined by the first rotation angle $\phi$ and the second rotation angle $\theta$. The Euler angle $\psi$ is related to a third rotation performed after the second rotation of the crystal Z plate 8, and represents a third rotation angle in which the Z axis after the second rotation is set as a rotation axis and a rotating direction from the +X axis after the second rotation to the +Y axis after the second rotation is defined as a positive rotating direction. The surface acoustic wave traveling direction is represented by the third rotation angle ψ about the X axis after the second rotation. The surface acoustic wave resonator 1 employs the crystal substrate 11 in which the first rotation angle φ is in the range of −1° to +1° and the second rotation angle θ is in the range of 26° to 40.7°. The IDT 12 is disposed so that the surface acoustic wave traveling direction ψ is in the range of 85° to 95°. The angle ψ is also referred to as an in-plane rotation angle. In this crystal substrate, the variation in frequency with the variation in temperature is small and thus the frequency-temperature characteristic is excellent.

In the IDT 12, electrode fingers 12a and 12b are alternately arranged so as to have different electrical polarities. In this embodiment, two neighboring electrode fingers 12a and 12b are counted as a pair of electrodes.

As shown in FIGS. 1 and 3, the IDT 12 is divided into three regions of a first region 14a at the center thereof and a second region 14b and a third region 14c on both sides thereof. The number of pairs of electrode fingers in the first region 14a is set to 20, the number of pairs of electrode fingers in the second region 14b is set to 40, and the number of pairs of electrode fingers in the third region 14c is set to 40. That is, the total number of pairs of electrode fingers in the IDT 12 is set to 100.

Here, the distance between the centers of the neighboring electrode fingers 12a and 12b is defined as an electrode finger pitch. The electrode finger pitch in the first region 14a is fixed to Pa. The electrode finger pitch in the second region 14b varies from $Pb_0$ to $Pb_M$. The electrode finger pitch in the second region 14b varies so as to gradually increase from a part adjacent to the first region 14a to an edge of the IDT 12. The electrode finger pitch in the third region 14c varies from $Pc_0$ to $Pc_N$. The electrode finger pitch in the third region 14c varies so as to gradually increase from a part adjacent to the first region 14a to the other edge of the IDT 12.

In the reflectors 13, plural electrode fingers 13a are arranged to be electrically neutral. Here, the reflectors 13 may be grounded or may be connected to one of the electrode fingers 12a and 12b. The electrode finger pitch which is the distance between the centers of the neighboring electrode fingers 13a is fixed to Pr.

In the reflectors 13, two neighboring electrode fingers 13a are counted as a pair of electrodes and 15 pairs of electrode fingers 13a are arranged on each side (30 pairs) in this embodiment.

The IDT 12 and the reflectors 13 are formed of a metal material such as aluminum (Al) and the thickness thereof is set to 0.06λ (where λ is the wavelength of a surface acoustic wave). The line width of the electrode fingers is set to 0.25%.

The electrode finger pitches are set to Pa=5.1743 μm, $Pb_M$=$Pc_N$=5.2354 μm, and Pr=5.2003 μm.

FIG. 4 is a graph illustrating the electrode finger pitch shown in FIG. 3 in terms of a frequency.

The frequency in the first region 14a of the IDT 12 is fixed to Fa. The frequency in the second region 14b varies in the range of $Fb_o$ to $Fb_M$. The frequency in the second region 14b varies to gradually decrease from a part adjacent to the first region 14a to an edge of the IDT 12. The frequency in the third region 14c varies in the range of $Fc_0$ to $Fc_N$. The frequency in the third region 14c varies to gradually decrease from a part adjacent to the first region 14a to the other edge of the IDT 12.

The frequencies are set to Fa=314.316 MHz and $Fb_M$=$Fc_N$=310.666 MHz.

The relation between the electrode finger position and the variation in electrode finger pitch in the surface acoustic wave resonator will be described below.

FIG. 5 shows the relation between the variation in electrode finger pitch with respect to the electrode finger pitch in the first region 14a of the IDT 12 and the electrode finger position. The electrode finger pitch gradually increases from the part adjacent to the first region 14a to both edges of the IDT 12. The variations in electrode finger pitch ($Pb_M$−Pa)/Pa×100 and ($Pc_N$−Pa)/Pa×100 at both edges of the IDT 12 are set to 1.2%. The variation in electrode finger pitch (Pr−Pa)/Pa×100 in the reflectors 13 is set to 0.5%.

In the surface acoustic wave resonator 1, the electrode fingers 12a and 12b of the IDT 12 have electrically opposite polarities and SH waves as surface acoustic waves are excited by applying an AV voltage to the IDT 12. The SH waves excited in the IDT 12 travel in the direction of arrow H, that is, the SH waves travel in the direction intersecting the electrode fingers 12a and 12b.

In the surface acoustic wave resonator 1 having the above-mentioned configuration, SH waves are excited in the IDT 12 and the Q value as a characteristic thereof is 20,000.

In this way, the frequency in the first region of the IDT is fixed and the second region and the third region include a portion in which the frequency gradually decreases as it approaches the edge. That is, the IDT is weighted with the frequency so that the frequencies at both edges of the IDT are lower than the frequency in the first region. Regarding the standing waves of the surface acoustic waves generated in the surface acoustic wave resonator, the vibration displacement in the first region disposed at the center of the IDT is great and the vibration displacement in the second region and the third region disposed on both sides thereof is small. The electrode finger pitch in the first region having the great vibration displacement is set to be constant so as to enhance the superposition of the reflected waves of the surface acoustic waves. The electrode finger pitch in the second region and the third region having the small vibration displacement is set to gradually increase to both edges of the IDT 12, whereby it is possible to enhance the amount of the reflected waves to the first region due to the frequency difference and to enhance the confinement effect of vibration energy in the IDT. Accordingly, it is possible to enhance the Q value of the surface acoustic wave resonator by this weighting.

When the frequency in the first region having the great vibration displacement gradually varies, the phase difference between the reflected waves of the surface acoustic waves increases and it becomes difficult to effectively superpose the reflected waves. The loss (conversion loss) due to the conversion of the surface acoustic waves into bulk waves also increases.

When the frequencies in the second region and the third region having the small vibration displacement are gradually varied, the phase difference between the reflected waves or the conversion loss into the bulk waves easily occurs, but it is possible to cause the reflection of the surface acoustic waves due to the frequency difference at a greater number of positions, that is, to enhance the amount of the reflected waves to the first region. The reflection of the surface acoustic waves due to the frequency difference is described in detail in JP-A-10-335966 and thus will not be described herein.

In this embodiment, as means for setting the frequency at the edges of the IDT to be lower than the frequency in the first region, the electrode finger pitch of the IDT is set to be greater.

The characteristics of the surface acoustic wave resonator according to this embodiment will be described in detail below.

Figure 6:
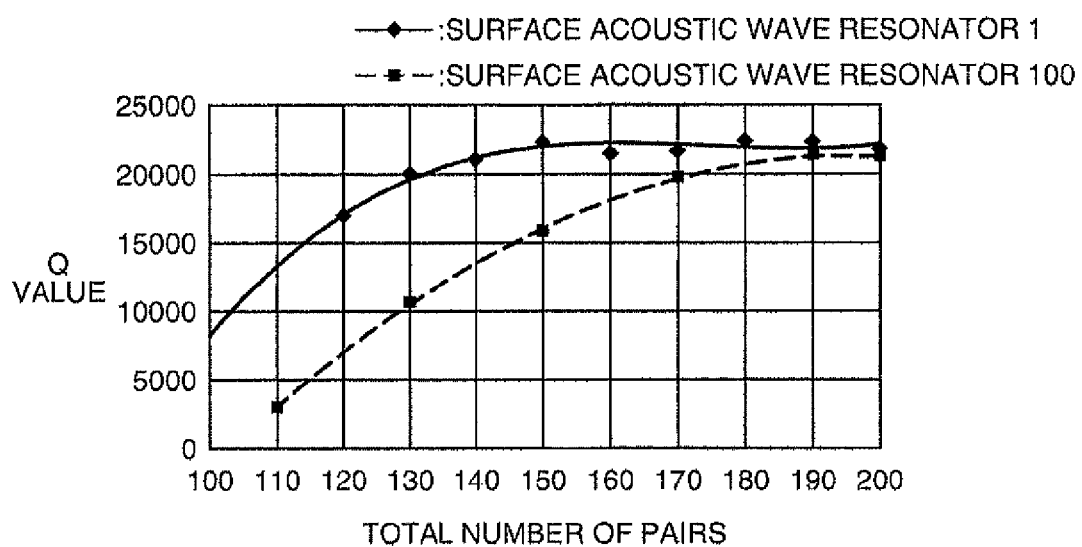
FIG. 6 is a graph illustrating the relation between the total number of pairs of electrode fingers and a Q value.
Figures 7, 8:
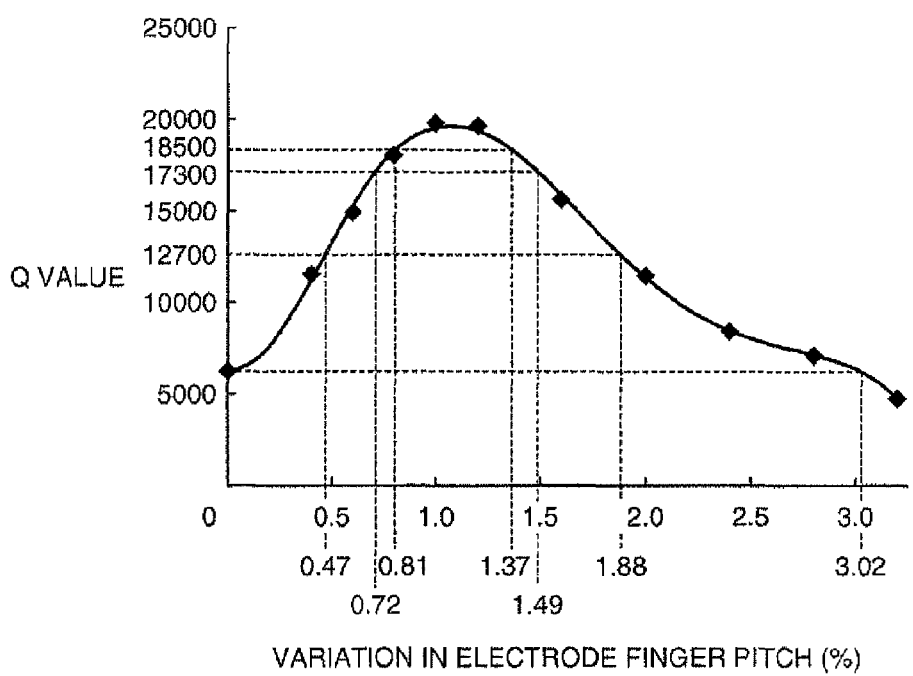
FIG. 7 is a table illustrating details of the numbers of pairs of electrode fingers in an IDT and reflectors with respect to the total number of pairs of electrode fingers.
FIG. 8 is a graph illustrating the relation between a variation in electrode finger pitch and the Q value.

FIG. 6 is a graph illustrating the relation between the sum (total number) of the number of pairs of electrode fingers in the IDT and the reflectors and the Q value. FIG. 7 is a table illustrating details of the numbers of pairs of electrode fingers in the IDT and the reflectors with respect to the total number of pairs of electrode fingers shown in FIG. 6.

The number of pairs of electrode fingers in the IDT is set to 100 pairs in total, where the number of pairs of electrode fingers in the first region is set to 20 and the numbers of pairs of electrode fingers in the second region and the third region are set to 40. The Q value is examined when the numbers of pairs of electrode fingers in the right and left reflectors are made to vary. Data of the convention surface acoustic wave resonator 100 is described in FIG. 6 for the purpose of comparison.

As shown in FIG. 6, in the surface acoustic wave resonator 1 according to this embodiment, the Q value of the surface acoustic wave resonator increases as the total number of pairs of electrode fingers increases. When the total number of pairs of electrode fingers is in the range of 100 to 140, the increase in the Q value in respect to the increase in the number of pairs of electrode fingers is great. When the total number of pairs of electrode fingers becomes greater than 150, the increase in the Q value is small in respect to the increase in the number of pairs of electrode fingers and approaches a saturated state.

As can be clearly seen from the drawing, the increase in the Q value of the surface acoustic wave resonator 1 according to this embodiment is more remarkable when the total number of pairs of electrode fingers is in the range of 110 to 150, which is a relatively small number of pairs of electrode fingers, in comparison with the conventional surface acoustic wave resonator 100. For example, when the total number of pairs of electrode fingers is 130, the Q value of 20,000 can be obtained.

In this way, according to this embodiment, since the Q value can be enhanced even with a small number of pairs of electrode fingers, it is possible to reduce the size of the surface acoustic wave resonator.

For example, in order to implement a surface acoustic wave resonator with a Q value of 10,000, 130 pairs of electrode fingers are necessary in the conventional surface acoustic wave resonator 100, but the Q value of 10,000 can be obtained by a total of 105 pairs of electrode fingers in the surface acoustic wave resonator according to this embodiment. In this way, according to this embodiment, it is possible to reduce the size of the surface acoustic wave resonator 1 without deteriorating the Q value.

FIG. 8 is a graph illustrating the relation between the variation in electrode finger pitch at the edges of the IDT and the Q value. As described with reference to FIG. 5, the variation in electrode finger pitch is a percentage of the increase in electrode finger pitch (the electrode finger pitch of a portion having the largest change) at the edges of the IDT with respect to the electrode finger pitch in the first region of the IDT.

The Q value increases as the variation in electrode finger pitch increases, the Q value is the greatest when the variation in electrode finger pitch is about 1.2%, and the Q value decreases when the variation in electrode finger pitch further increases.

As can be seen from this graph, when the variation in electrode finger pitch is equal to or less than 3.02%, it is possible to increase the Q value by varying the electrode finger pitch. When the variation in electrode finger pitch is greater than 0.47% and less than 1.88%, it is possible to obtain a Q value greater than 12,700 which is the Q value of the conventional surface acoustic wave resonator 110. When the variation in electrode finger pitch is equal to or greater than 0.72% and equal to or less than 1.49%, it is possible to obtain a Q value equal to or greater than 17,300. When the variation in electrode finger pitch is equal to or greater than 0.81% and equal to or less than 1.37%, it is possible to obtain a Q value equal to or greater than 18,500.

Here, the frequency in the IDT can be calculated by the following expression.

$$F = V/\lambda = V/2P \quad (1)$$

Here, F represents a frequency, V represents a traveling speed of a surface acoustic wave, $\lambda$ represents a wavelength of the surface acoustic wave, and P represents an electrode finger pitch.

Figures 9, 10:
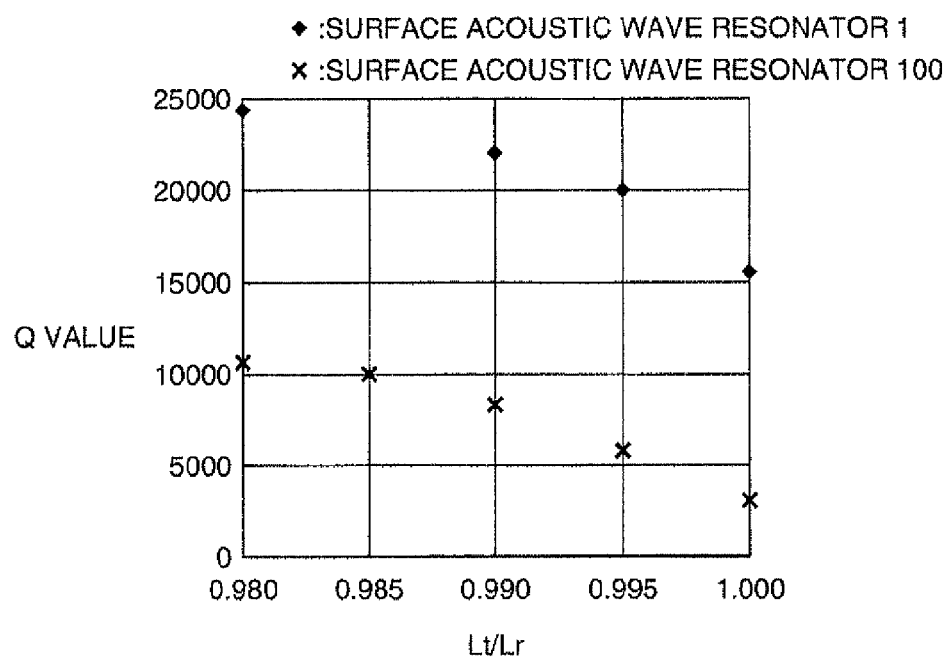
FIG. 9 is a table illustrating a normalized electrode finger pitch and a normalized frequency with respect to the variation in electrode finger pitch.
FIG. 10 is a graph illustrating the relation between the Q value and a ratio of the electrode finger pitch in the reflectors and the electrode finger pitch with the same polarity in a first region of the IDT.

The variations in electrode finger pitch are converted into the values shown in FIG. 9 by the use of Expression 1.

Here, Pa represents the electrode finger pitch in the first region, $Pb_M$ represents the electrode finger pitch in the second region, and $Pc_N$ represents the electrode finger pitch in the third region. The electrode finger pitches are normalized with the electrode finger pitch Pa in the first region ($Pb_M/Pa$ and $Pc_N/Pa$).

Fa represents the frequency in the first region, $Fb_M$ represents the frequency in the second region, and $Fc_N$ represents the frequency in the third region. The frequencies are normalized with the frequency Fa in the first region ($Fb_M/Pa$ and $Fc_N/Pa$).

From this result, it is possible to get the range in which the excellent Q value can be obtained using the normalized electrode finger pitch from the variation in electrode finger pitch or the normalized frequency.

For example, when the normalized electrode finger pitches ($Pb_M/Pa$ and $Pc_N/Pa$) are equal to or less than 1.0302, it can be seen that the effect of the varying of the electrode finger pitch can be exhibited. When the normalized electrode finger pitches ($Pb_M/Pa$ and $Pc_N/Pa$) are greater than 1.0047 and less than 1.0188, it is possible to obtain the Q value greater than 12,700 which is the Q value in the conventional surface acoustic wave resonator 110. When the normalized electrode finger pitches ($Pb_M/Pa$ and $Pc_N/Pa$) are equal to or greater than 1.0072 and equal to or less than 1.0149, it is possible to obtain the Q value equal to or greater than 17,300. When the normalized electrode finger pitches ($Pb_M/Pa$ and $Pc_N/Pa$) are equal to or greater than 1.0081 and equal to or less than 1.0137, it is possible to obtain the Q value equal to or greater than 18,500.

When the normalized frequencies ($Fb_M/Fa$ and $Fc_N/Fa$) are equal to or greater than 0.9707, it can be seen that the effect of the varying of the electrode finger pitch can be exhibited. When the normalized frequencies ($Fb_M/Fa$ and $Fc_N/Fa$) are greater than 0.9815 and less than 0.9953, it is possible to obtain the Q value greater than 12,700 which is the Q value in the conventional surface acoustic wave resonator 110. When the normalized frequencies ($Fb_M/Fa$ and $Fc_N/Fa$) are equal to or greater than 0.9853 and equal to or less than 0.9929, it is possible to obtain the Q value equal to or greater than 17,300. When the normalized frequencies ($Fb_M/Fa$ and $Fc_N/Fa$) are equal to or greater than 0.9865 and equal to or less than 0.9920, it is possible to obtain the Q value equal to or greater than 18,500.

FIG. 10 is a graph illustrating the relation between a ratio of the electrode finger pitch in the reflectors and the electrode finger pitch with the same polarity in the first region of the IDT and the Q value.

As shown in FIG. 1, the distance between the centers of the electrode fingers with the same polarity in the first region of the IDT 12 is defined as Lt and the distance between the centers of the electrode fingers adjacent to both sides of one electrode finger in the reflectors 13 is defined as Lr. The relation between Lt/Lr and the Q value is shown in FIG. 10.

As can be seen from the graph shown in FIG. 10, when Lt/Lr is in the range of 0.980 to 1.000, the Q value decreases with the increase in Lt/Lr. That is, when the electrode finger pitch Lr in the reflectors is greater than the electrode finger pitch Lt in the IDT, the Q value is greater. This tendency is the same as the conventional surface acoustic wave resonator 100.

The influence of the number of pairs of electrode fingers in the first region having a fixed electrode finger pitch Pa on the Q value will be described below.

Figure 11:
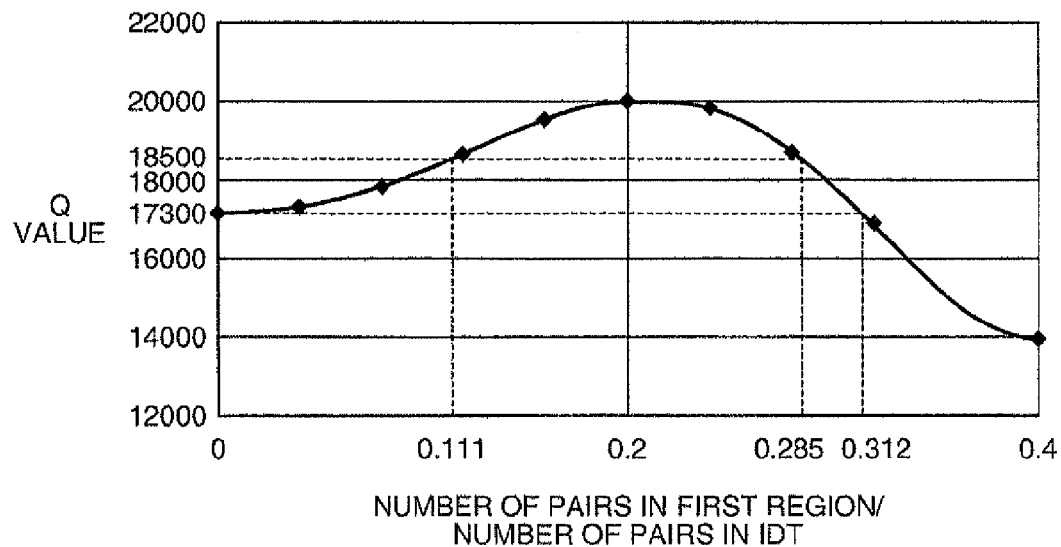
FIG. 11 is a graph illustrating the relation between the Q value and a ratio of the number of pairs of electrode fingers in the first region to the total number of pairs of electrode fingers in the IDT.

FIG. 11 is a graph illustrating the relation between the ratio of the number of pairs of electrode fingers in the first region to the total number of pairs of electrode fingers in the IDT and the Q value.

As can be seen from this graph, the Q value increases as the ratio of the number of pairs of electrode fingers in the first region to the total number of pairs of electrode fingers in the IDT increases, the Q value is the maximum when the number of pairs of electrode fingers in the first region is about 20%, and the Q value decreases as the ratio of the number of pairs of electrode fingers in the first region further increases.

From this result, it is possible to guarantee the Q value equal to or greater than 17,300 when the ratio of the number of pairs of electrode fingers in the first region to the total number of pairs of electrode fingers in the IDT is equal to or less than 31.2%. When the ratio of the number of pairs of electrode fingers in the first region to the total number of pairs of electrode fingers in the IDT is equal to or greater than 11.1% and equal to or less than 28.5%, it is possible to guarantee the Q value equal to or greater than 18,500.

In order to guarantee a stable characteristic, it is preferable that the number of pairs of electrode fingers in the first region is set to two or more.

Figure 12:
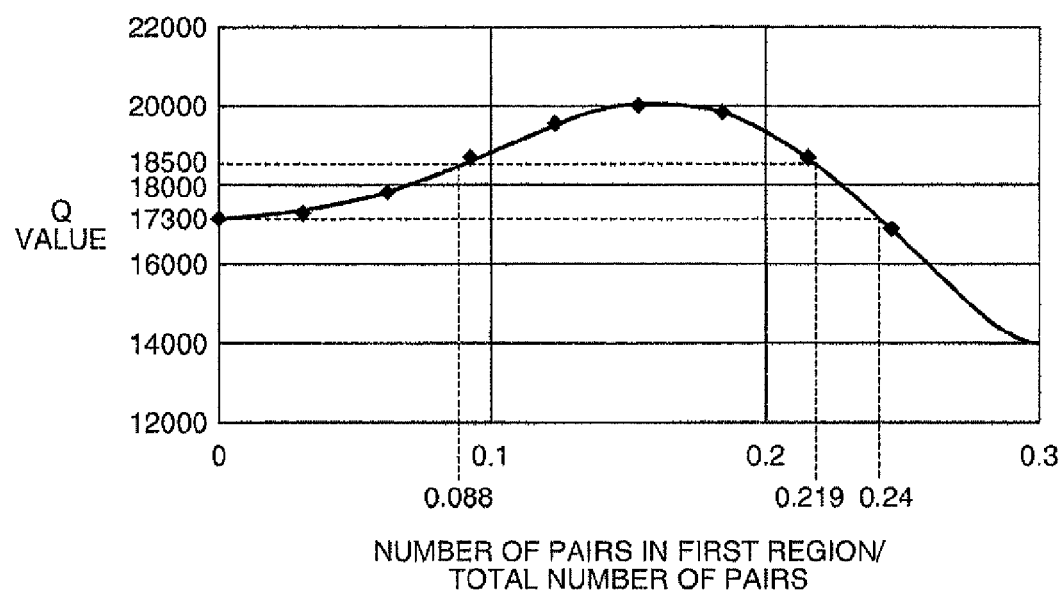
FIG. 12 is a graph illustrating the relation between the Q value and a ratio of the number of pairs of electrode fingers in the first region to the total number of pairs of electrode fingers.

FIG. 12 is a graph illustrating the relation between the ratio of the number of pairs of electrode fingers in the first region to the total number of pairs of electrode fingers, which is the sum of the number of pairs of electrode fingers in the IDT and the number of pairs of electrode fingers in the reflectors, and the Q value.

The number of pairs of electrode fingers in the reflectors is the sum of the number of pairs of electrode fingers Nr1 in the reflector disposed on one side of the IDT and the number of pairs of electrode fingers Nr2 in the reflector disposed on the other side of the IDT.

As can be seen from this graph, the Q value increases as the ratio of the number of pairs of electrode fingers in the first region to the total number of pairs of electrode fingers in the IDT increases, the Q value is the maximum when the number of pairs of electrode fingers in the first region is about 16%, and the Q value decreases as the ratio of the number of pairs of electrode fingers in the first region further increases.

From this result, it is possible to guarantee the Q value equal to or greater than 17,300 when the ratio of the number of pairs of electrode fingers in the first region to the total number of pairs of electrode fingers is equal to or less than 24%. When the ratio of the number of pairs of electrode fingers in the first region to the total number of pairs of electrode fingers in the IDT is equal to or greater than 8.8% and equal to or less than 21.9%, it is possible to guarantee the Q value equal to or greater than 18,500.

In order to guarantee a stable characteristic, it is preferable that the number of pairs of electrode fingers in the first region is set to two or more.

The number of pairs of electrode fingers Nr1 in the reflector disposed on one side of the IDT need not be equal to the number of pairs of electrode fingers Nr2 in the reflector disposed on the other side of the IDT.

The relation between the shift amount of the electrode finger pitch or the variation in frequency between the neighboring electrode fingers in the second region and the third region and the Q value will be described below.

Figure 13:
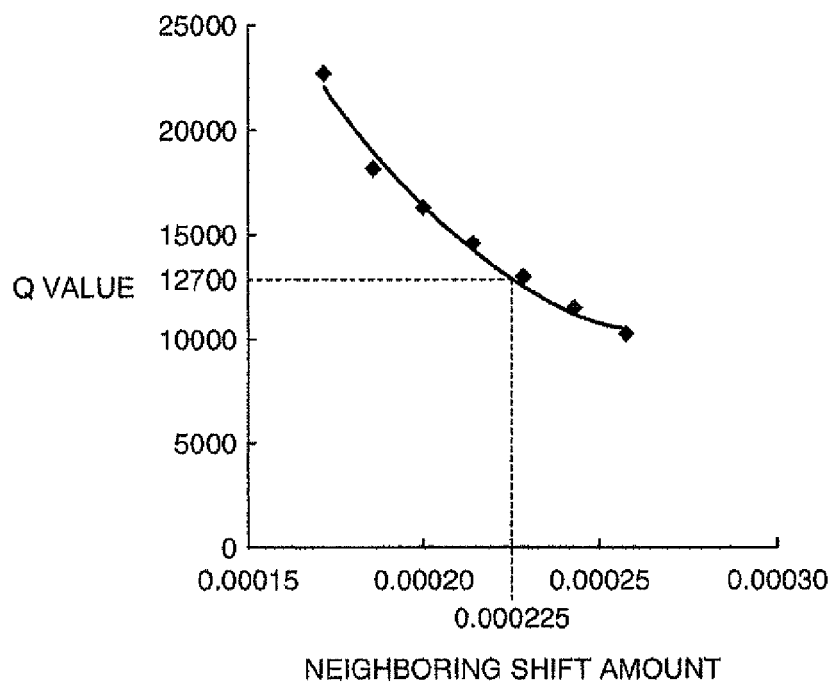
FIG. 13 is a graph illustrating the relation between the Q value and a shift amount of the electrode finger pitch in neighboring electrode fingers.

FIG. 13 is a graph illustrating the relation between the shift amount of the electrode finger pitch between the neighboring electrode fingers and the Q value.

When the electrode finger pitch at a position in the second region is $Pb_m$ and the electrode finger pitch at a position adjacent thereto is $Pb_{m+1}$, the shift amount of the electrode finger pitch between the neighboring electrode fingers is $|Pb_{m+1}-Pb_m|/Pb_m$. When the electrode finger pitch at a position in the third region is $Pc_n$ and the electrode finger pitch at a position adjacent thereto is $Pc_{n+1}$, the shift amount of the electrode finger pitch between the neighboring electrode fingers is $|Pc_{n+1}-Pc_n|/Pc_n$.

From this graph, it can be seen that the Q value decreases as the shift amount of the neighboring electrode finger pitches increases. When the shift amount of the neighboring electrode finger pitches is in the range of $0<|Pb_{m+1}-Pb_m|/Pb_m<0.000225$ and $0<|Pc_{n+1}-Pc_n|/Pc_n<0.000225$, the Q value is greater than that of the conventional surface acoustic wave resonator 100 and it is possible to guarantee the Q value greater than 12,700.

Figure 14:
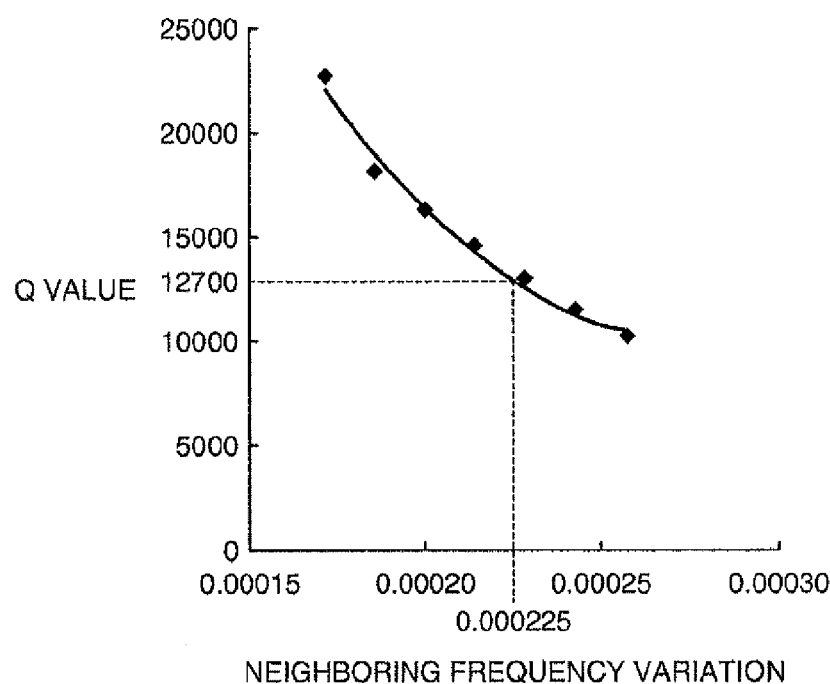
FIG. 14 is a graph illustrating the relation between the Q value and a frequency variation of neighboring electrode fingers.

FIG. 14 is a graph illustrating the relation between the variation in frequency between the neighboring electrode fingers and the Q value.

When the frequency at a position in the second region is $Fb_m$ and the frequency at a position adjacent thereto is $Fb_{m+1}$, the variation in frequency between the neighboring electrode fingers is $|Fb_{m+1}-Fb_m|/Fb_m$. When the frequency at a position in the third region is $Fc_n$ and the frequency at a position adjacent thereto is $Fc_{n+1}$, the variation in frequency between the neighboring electrode fingers is $|Fc_{n+1}-Fc_n|/Fc_n$.

From this graph, it can be seen that the Q value decreases as the variation in frequency between the neighboring electrode fingers increases.

When the variation in frequency between the neighboring positions is in the range of $0<|Fb_{m+1}-Fb_m|/Fb_m<0.000225$ and $0<|Fc_{n+1}-Fc_n|/Fc_n<0.000225$, the Q value is greater than that of the conventional surface acoustic wave resonator 100 and it is possible to guarantee the Q value greater than 12,700.

The relation between the normalized thickness and the variation in frequency will be described below.

Figure 15:
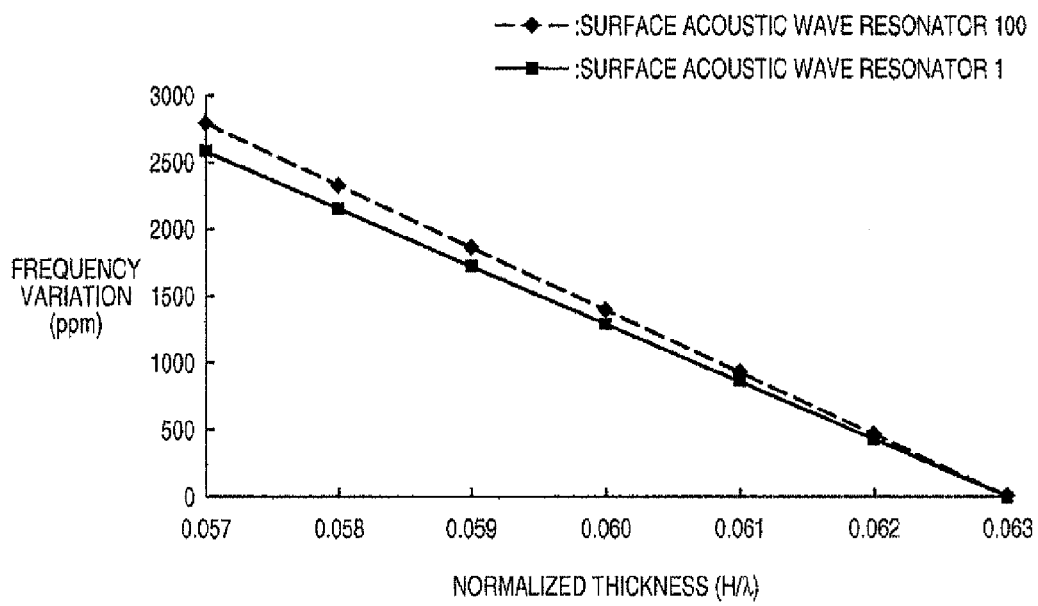
FIG. 15 is a graph illustrating the relation between a normalized thickness and the frequency variation.

FIG. 15 is a graph illustrating the relation between the normalized thickness and the variation in frequency.

When the thickness of the electrode film of the IDT is H and the wavelength of a surface acoustic wave is $\lambda$, the normalized thickness $H/\lambda$, is obtained by normalizing the thickness H of the electrode film with the wavelength $\lambda$.

In FIG. 15, data of the conventional surface acoustic wave resonator 100 is described together.

As can be seen from this graph, the frequency varies by about 465 ppm when the normalized thickness $H/\lambda$, varies by 0.001 in the conventional surface acoustic wave resonator 100, but the frequency varies by about 432 ppm when the normalized thickness $H/\lambda$ varies by 0.001 in the surface acoustic wave resonator 1 according to this embodiment.

As a result, the variation in frequency with the variation of the normalized thickness $H/\lambda$ in the surface acoustic wave resonator 1 according to this embodiment is smaller than that in the conventional surface acoustic wave resonator 100. That is, it is possible to reduce the variation in frequency due to the variation in thickness of the IDT. Therefore, in the manufacture of surface acoustic wave resonators, it is possible to reduce the frequency difference due to the thickness of the IDT and thus to easily control the frequency.

As described above, the IDT in the surface acoustic wave resonator 1 according to this embodiment has a fixed frequency in the first region disposed at the center and a portion in which the frequency gradually decreases as it approaches the edges in the second region and the third region disposed on both sides thereof. A periodic structure having the same electrode finger pitch is employed for the first region so as to keep the frequency constant. By employing this equal-pitch periodic structure, the surface acoustic waves reflected by the neighboring electrode ends have the same phase state (in-phase state), thereby causing a strong resonant condition. In the real resonator including a finite IDT, the standing-wave state is established at the central portion of the IDT where the reflected waves from the front and back in the surface acoustic wave traveling direction are sufficiently superposed, whereby the strong resonant condition is obtained and the surface displacement also increases.

On the other hand, in the second region and the third region of the IDT, the superposition of the reflected waves is weak and the surface displacement is also small. However, even when the superposition of the reflected waves is weak due to a non-periodic structure, the confinement of energy in the whole resonator is enhanced and the resonant condition as a resonator is enhanced to enhance the Q value, by decreasing the frequency in the portions by the use of the central portion of the IDT.

In this way, in order to enhance the Q value as a resonator to strengthen the resonant condition, it is preferable that the periodic structure having the same electrode finger pitch is employed for the central portion of the IDT and the non-periodic structure for decreasing the frequency is employed for the edge portions of the IDT. Particularly, it is effective to decrease the frequency as it approaches the edges of the IDT where the resonant condition is weakened.

Surface acoustic wave resonators according to modifications of the first embodiment of the invention will be described below.

(Modification 1)

Figure 16:
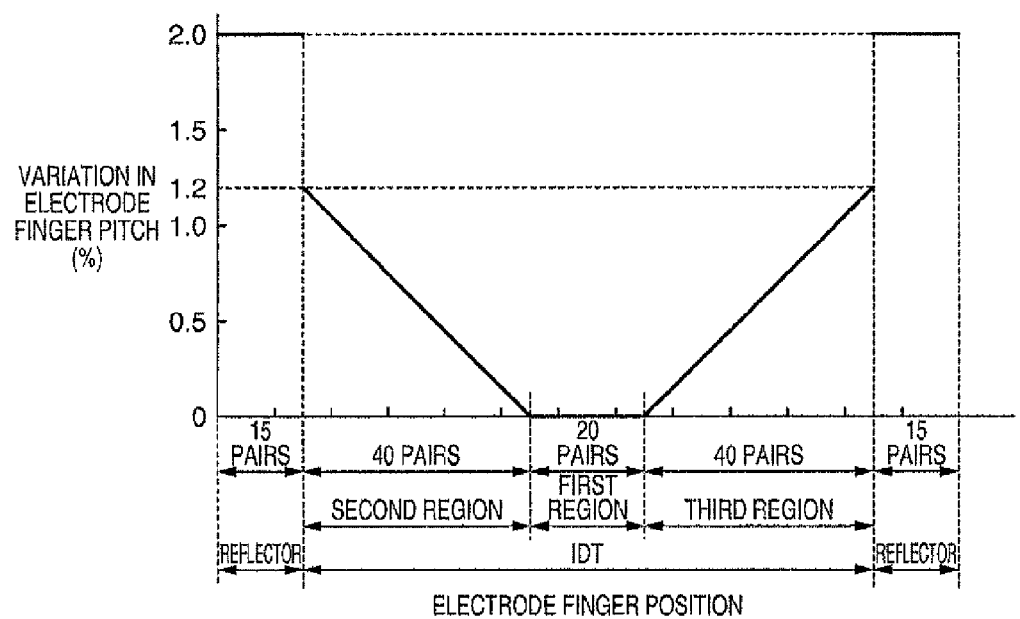
FIG. 16 is a diagram illustrating the relation between the electrode finger position and the variation in electrode finger pitch in Modification 1.

FIG. 16 is a diagram illustrating the relation between the electrode finger position and the variation in electrode finger pitch in a surface acoustic wave resonator according to Modification 1. Modification 1 is different from the first embodiment, in the variation in electrode finger pitch in the reflectors.

The electrode finger pitch gradually increases from a part adjacent to the first region to both edges of the IDT and the variation in electrode finger pitch at both edges of the IDT is 1.2%. The variation in electrode finger pitch in the reflectors is 2.0%.

In the first embodiment, the variation in electrode finger pitch in the reflectors is set to be smaller than the variation in electrode finger pitch at the edges of the IDT. However, as shown in FIG. 16, the variation in electrode finger pitch in the reflectors may be set to be greater than the variation in electrode finger pitch at the edges of the IDT.

The same advantages as the first embodiment can be obtained from this configuration.

(Modification 2)

Figure 17:
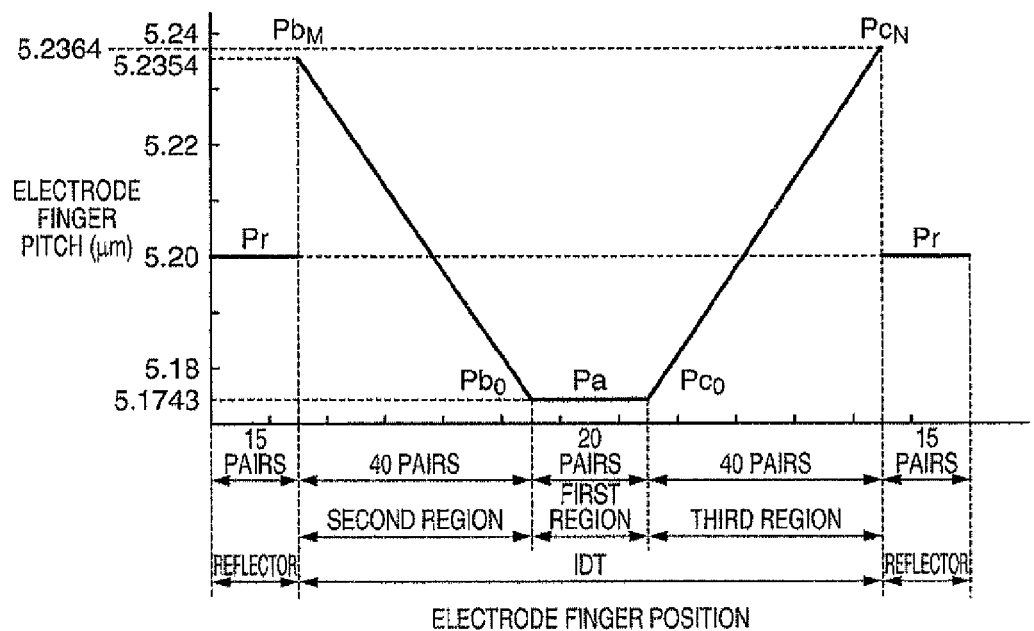
FIG. 17 is a diagram illustrating the relation between the electrode finger position and the electrode finger pitch in Modification 2.

FIG. 17 is a diagram illustrating the relation between the electrode finger position and the electrode finger pitch in a surface acoustic wave resonator according to Modification 2.

Modification 2 is different from the first embodiment, in that the electrode finger pitches (frequencies) at the edges of the second region and the third region of the IDT are different from each other.

The electrode finger pitch in the first region of the IDT is fixed to Pa. The electrode finger pitch in the second region varies in the range of $Pb_0$ to $Pb_M$. The electrode finger pitch in the second region varies so as to gradually increase from a part adjacent to the first region to an edge of the IDT. The electrode finger pitch in the third region varies in the range of $Pc_0$ to $Pc_N$. The electrode finger pitch in the third region varies so as to gradually increase from a part adjacent to the first region to the other edge of the IDT. The electrode finger pitches at the edges of the second region and the third region are set to $Pb_M \neq Pc_N$.

The electrode finger pitch which is the distance between the centers of the neighboring electrode fingers in the reflectors is fixed to Pr.

The number of pairs of electrode fingers in the first region is set to 20, the number of pairs of electrode fingers in the second region is set to 40, and the number of pairs of electrode fingers in the third region is set to 40. That is, the total number of pairs of electrode fingers in the IDT is set to 100. The number of pairs of electrode fingers in each of the right and left reflectors is set to 15.

The electrode finger pitches are set to Pa=5.1743 μm, $Pb_M$=5.2354 μm, $Pc_N$=5.2364 μm, and Pr=5.2003 μm.

Figure 18:
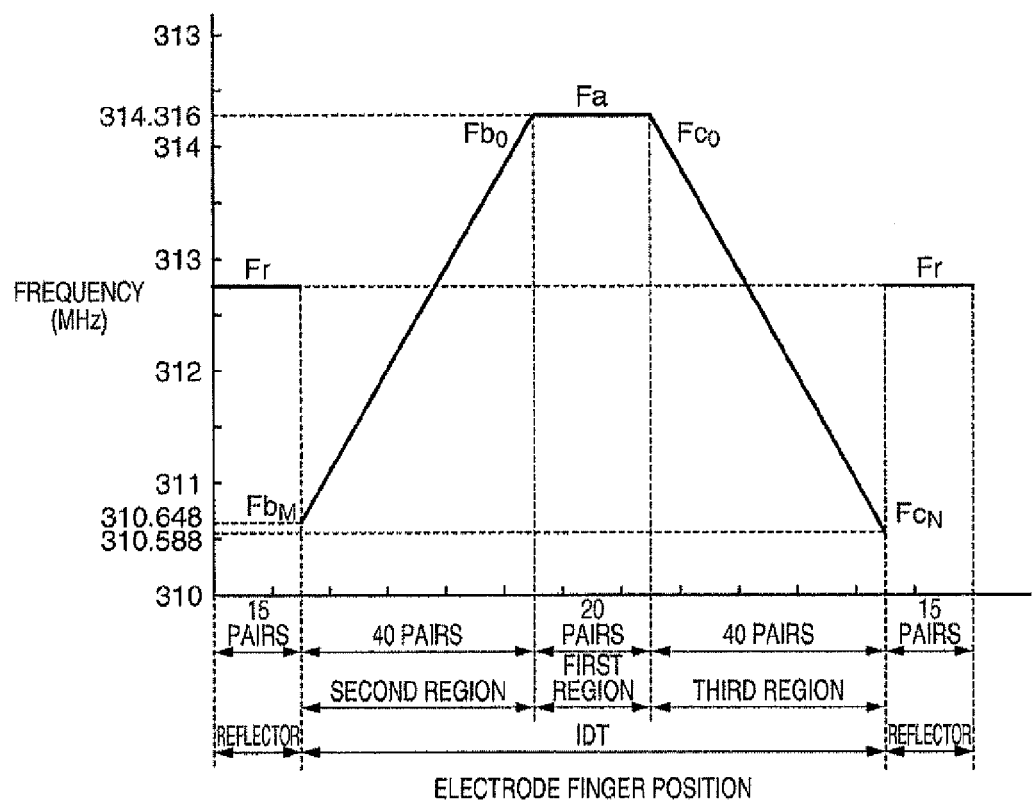
FIG. 18 is a diagram illustrating the relation between the electrode finger position and the frequency in Modification 2.

FIG. 18 is a graph illustrating the electrode finger pitch shown in FIG. 17 in terms of a frequency.

The frequency in the first region of the IDT is fixed to Fa. The frequency in the second region varies in the range of $Fb_0$ to $Fb_M$. The frequency in the second region varies so as to gradually decrease from a part adjacent to the first region to an edge of the IDT. The frequency in the third region varies in the range of $Fc_0$ to $Fc_N$. The frequency in the third region varies so as to gradually decrease from a part adjacent to the first region to the other edge of the IDT. The frequencies at the edges of the second region and the third region are set to $Fb_M \neq Fc_N$.

The frequencies are set to Fa=314.316 MHz, $Fb_M$=310.648 MHz, and $Fc_N$=310.588 MHz.

In the surface acoustic wave resonator having the above-mentioned configuration, surface acoustic waves are excited in the IDT and the Q value as a characteristic is 19,700.

(Modification 3)

Figure 19:
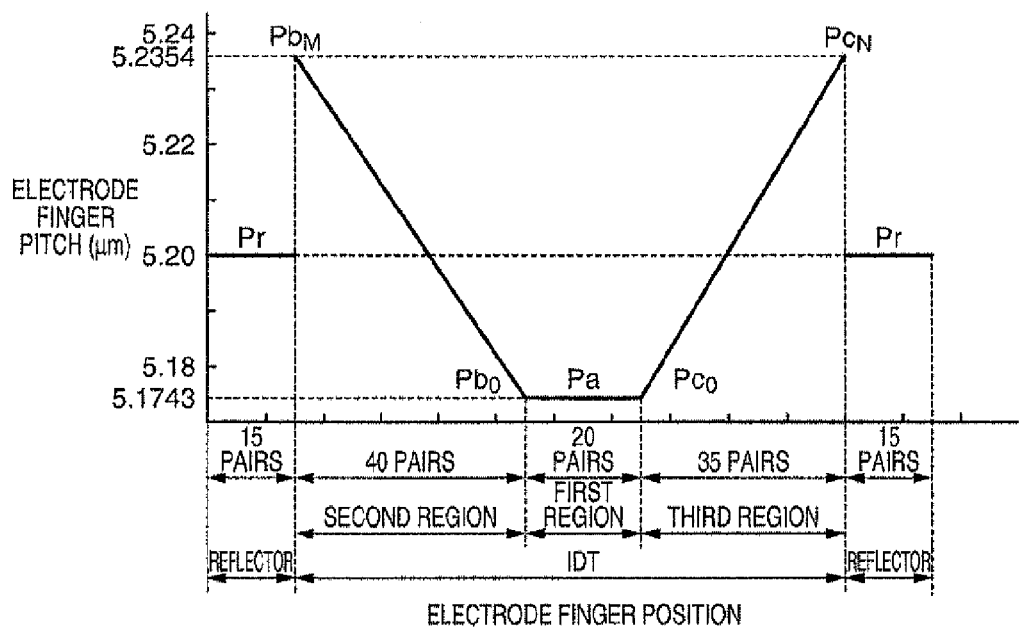
FIG. 19 is a diagram illustrating the relation between the electrode finger position and the electrode finger pitch in Modification 3.

FIG. 19 is a diagram illustrating the relation between the electrode finger position and the electrode finger pitch in a surface acoustic wave resonator according to Modification 3.

Modification 3 is different from the first embodiment, in that the numbers of pairs of electrode fingers in the second region and the third region of the IDT are set to be different from each other.

The electrode finger pitch in the first region of the IDT is fixed to Pa. The electrode finger pitch in the second region varies in the range of $Pb_0$ to $Pb_M$. The electrode finger pitch in the second region varies so as to gradually increase from a part adjacent to the first region to an edge of the IDT. The electrode finger pitch in the third region varies in the range of $Pc_0$ to $Pc_N$. The electrode finger pitch in the third region varies so as to gradually increase from a part adjacent to the first region to the other edge of the IDT. The electrode finger pitches at the edges of the second region and the third region are set to $Pb_M = Pc_N$.

The electrode finger pitch which is the distance between the centers of the neighboring electrode fingers in the reflectors is fixed to Pr.

The number of pairs of electrode fingers in the first region is set to 20, the number of pairs of electrode fingers in the second region is set to 40, and the number of pairs of electrode fingers in the third region is set to 35. That is, the total number of pairs of electrode fingers in the IDT is set to 95. The number of pairs of electrode fingers in each of the right and left reflectors is set to 15.

The electrode finger pitches are set to Pa=5.1743 µm, $Pb_M$=$Pc_N$=5.2354 µm, and Pr=5.2003 µm.

Figure 20:
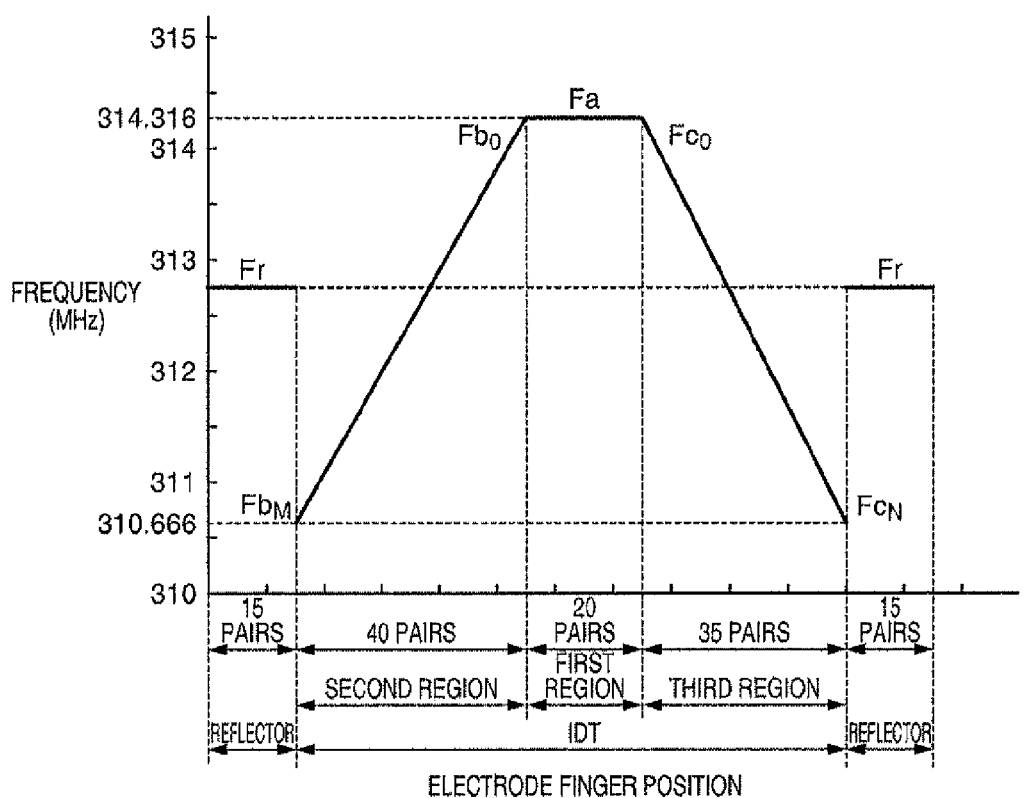
FIG. 20 is a diagram illustrating the relation between the electrode finger position and the frequency in Modification 3.

FIG. 20 is a graph illustrating the electrode finger pitch shown in FIG. 19 in terms of a frequency.

The frequency in the first region of the IDT is fixed to Fa. The frequency in the second region varies in the range of $Fb_0$ to $Fb_M$. The frequency in the second region varies so as to gradually decrease from a part adjacent to the first region to an edge of the IDT. The frequency in the third region varies in the range of $Fc_0$ to $Fc_N$. The frequency in the third region varies so as to gradually decrease from a part adjacent to the first region to the other edge of the IDT.

The frequencies are set to Fa=314.316 MHz and $Fb_M$=$Fc_N$=310.666 MHz.

In the surface acoustic wave resonator having the above-mentioned configuration, surface acoustic waves are excited in the IDT and the Q value as a characteristic is 18,500.

(Modification 4)

Figure 21:
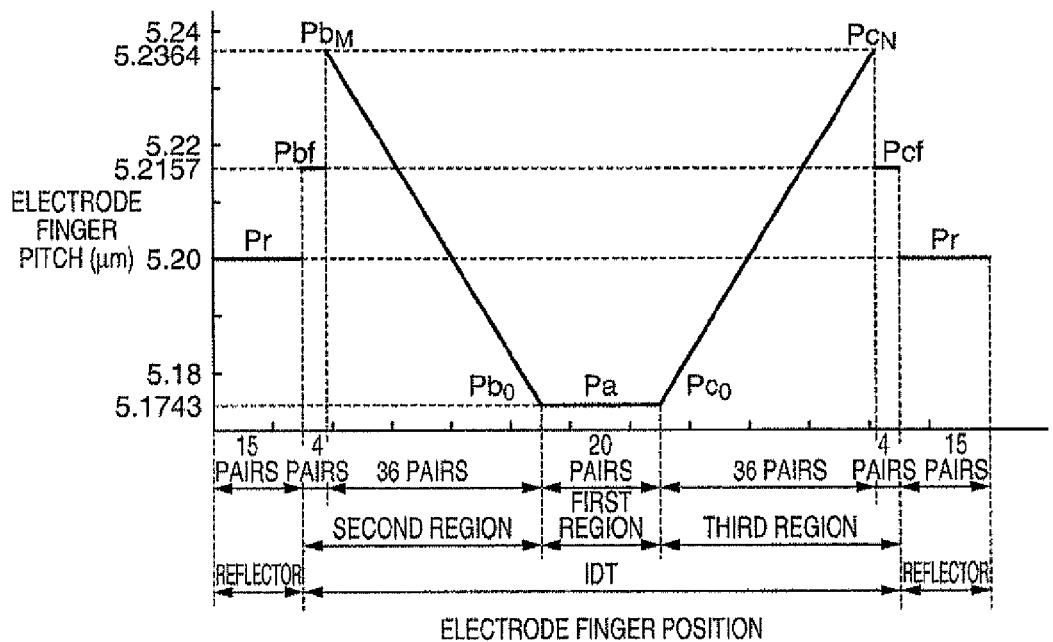
FIG. 21 is a diagram illustrating the relation between the electrode finger position and the electrode finger pitch in Modification 4.

FIG. 21 is a diagram illustrating the relation between the electrode finger position and the electrode finger pitch in a surface acoustic wave resonator according to Modification 4.

Modification 4 is different from the first embodiment, in that a portion having a fixed electrode finger pitch is disposed at the edges of the second region and the third region of the IDT.

The electrode finger pitch in the first region of the IDT is fixed to Pa. The electrode finger pitch in the second region varies so as to gradually increase from a part adjacent to the first region to an edge of the IDT. The electrode finger pitch in the second region varies in the range of $Pb_0$ to $Pb_M$ and the portion in which the electrode finger pitch is fixed to $Pb_f$ is disposed at the edge of the IDT. The electrode finger pitch $Pb_f$ at the edge of the IDT is set to be smaller than the electrode finger pitch $Pb_M$ in the second region.

The electrode finger pitch in the third region varies so as to gradually increase from a part adjacent to the first region to the other edge of the IDT. The electrode finger pitch in the third region varies in the range of $Pc_0$ to $Pc_N$ and the portion in which the electrode finger pitch is fixed to $Pc_f$ is disposed at the other edge of the IDT. The electrode finger pitch $Pc_f$ at the edge of the IDT is set to be smaller than the electrode finger pitch $Pc_N$ in the third region. The electrode finger pitches in the second region and the third region are set to $Pb_M$=$Pc_N$ and $Pb_f$=$Pc_f$.

The electrode finger pitch which is the distance between the centers of the neighboring electrode fingers in the reflectors is fixed to Pr.

The number of pairs of electrode fingers in the first region is set to 20, the number of pairs of electrode fingers in the second region is set to 40 among which 4 pairs of electrode fingers are arranged in the portion having the fixed electrode finger pitch at the edge, and the number of pairs of electrode fingers in the third region is set to 40 among which 4 pairs of electrode fingers are arranged in the portion having the fixed electrode finger pitch at the edge. That is, the total number of pairs of electrode fingers in the IDT is set to 100. The number of pairs of electrode fingers in each of the right and left reflectors is set to 15.

The electrode finger pitches are set to Pa=5.1743 µm, $Pb_M$=$Pc_N$=5.2364 µm, $Pb_f$=$Pc_f$=5.2157 µm, and Pr=5.2003 µm.

Figure 22:
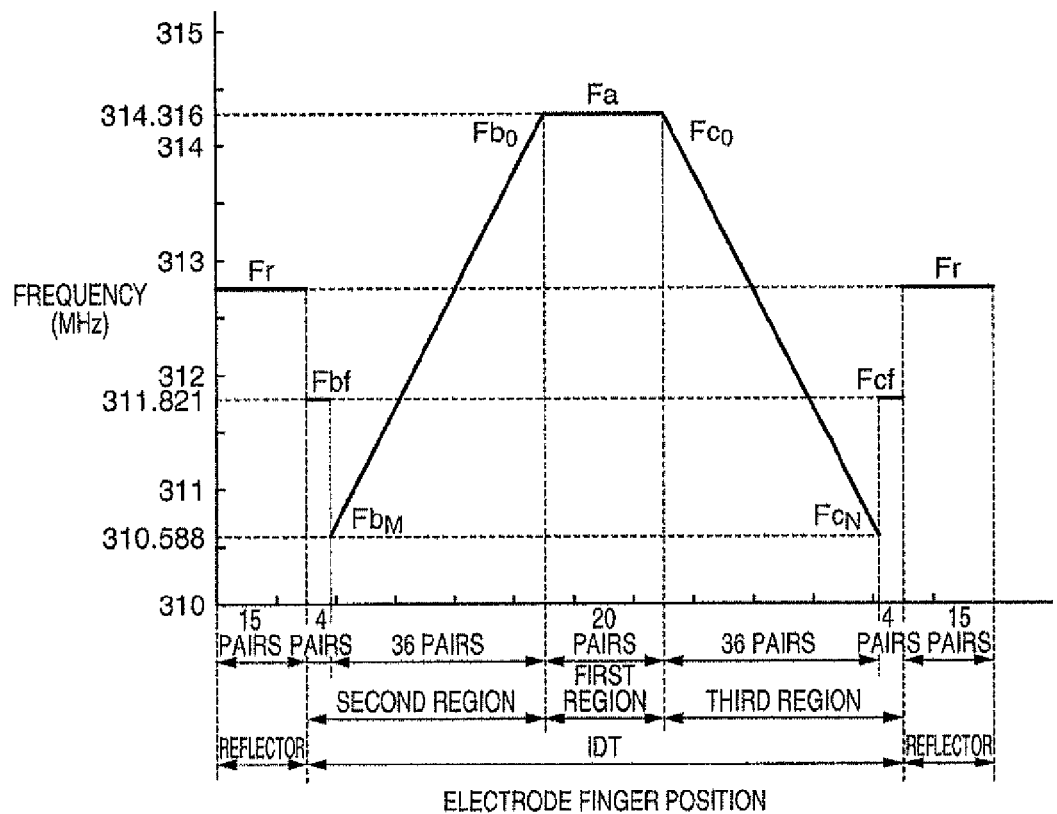
FIG. 22 is a diagram illustrating the relation between the electrode finger position and the frequency in Modification 4.

FIG. 22 is a graph illustrating the electrode finger pitch shown in FIG. 21 in terms of a frequency.

The frequency in the first region of the IDT is fixed to Fa. The frequency in the second region varies so as to gradually decrease from a part adjacent to the first region to an edge of the IDT.

The frequency in the second region varies in the range of $Fb_0$ to $Fb_N$ and the portion in which the frequency is fixed to $Fb_f$ is disposed at an edge of the IDT. The frequency $Fb_f$ at the edge of the IDT is set to be greater than the frequency $Fb_M$ in the second region.

The frequency in the third region varies so as to gradually increase from a part adjacent to the first region to the other edge of the IDT. The frequency in the third region varies in the range of $Fc_0$ to $Fc_N$ and the portion in which the frequency is fixed to $Fc_f$ is disposed at the other edge of the IDT. The frequency $Fc_f$ at the edge of the IDT is set to be greater than the frequency $Fc_N$ in the second region.

The frequencies are set to Fa=314.316 MHz, $Fb_M$=$Fc_N$=310.588 MHz, and $Fb_f$=$Fc_f$=311.821 MHz.

In the surface acoustic wave resonator having the above-mentioned configuration, surface acoustic waves are excited in the IDT and the Q value as a characteristic is 17,200.

(Modification 5)

Figure 23:
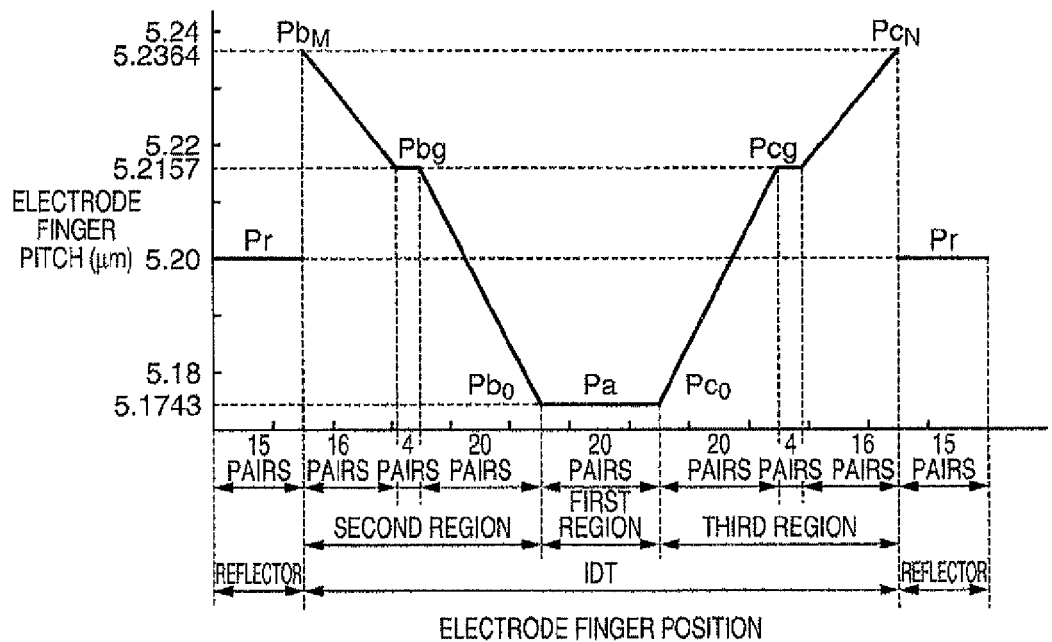
FIG. 23 is a diagram illustrating the relation between the electrode finger position and the electrode finger pitch in Modification 5.

FIG. 23 is a diagram illustrating the relation between the electrode finger position and the variation in electrode finger pitch in a surface acoustic wave resonator according to Modification 5.

Modification 5 is different from the first embodiment, in that a portion having a fixed electrode finger pitch is disposed in the second region and the third region of the IDT.

The electrode finger pitch in the first region of the IDT is fixed to Pa. The electrode finger pitch in the second region varies so as to gradually increase from a part adjacent to the first region to an edge of the IDT. The electrode finger pitch in the second region varies in the range of $Pb_D$ to $Pb_g$ from the part adjacent to the first region, the portion in which the electrode finger pitch is fixed to $Pb_g$ is disposed, and the electrode finger pitch subsequently varies up to $Pb_M$ to the edge of the IDT.

The electrode finger pitch in the third region varies so as to gradually increase from a part adjacent to the first region to the other edge of the IDT. The electrode finger pitch in the third region varies in the range of $Pc_0$ to $Pc_g$ from the part adjacent to the first region, the portion in which the electrode finger pitch is fixed to $Pb_g$ is disposed, and the electrode finger pitch subsequently varies up to $Pc_N$ to the edge of the IDT.

The electrode finger pitches in the second region and the third region are set to $Pb_g$=$Pc_g$ and $Pb_M$=$Pc_N$.

The electrode finger pitch which is the distance between the centers of the neighboring electrode fingers in the reflectors is fixed to Pr.

The number of pairs of electrode fingers in the second region is set to 40 among which 20 pairs of electrode fingers have an electrode finger pitch in the range of $Pb_0$ to $Pb_g$, 4 pairs of electrode fingers have the fixed electrode finger pitch, and 16 pairs of electrode fingers has an electrode finger pitch in the range of $Pb_g$ to $Pb_M$. Similarly, the number of pairs of electrode fingers in the third region is set to 40 among which 20 pairs of electrode fingers have an electrode finger pitch in the range of $Pc_0$ to $Pc_g$, 4 pairs of electrode fingers have the fixed electrode finger pitch, and 16 pairs of electrode fingers has an electrode finger pitch in the range of $Pc_g$ to $Pc_N$. The number of pairs of electrode fingers in the first region is set to 20. That is, the total number of pairs of electrode fingers in the IDT is set to 100. The number of pairs of electrode fingers in each of the right and left reflectors is set to 15.

The electrode finger pitches are set to Pa=5.1743 µm, $Pb_M$=$Pc_N$=5.2364 µm, $Pb_g$=$Pc_g$=5.2157 µm, and Pr=5.2003 µm.

Figure 24:
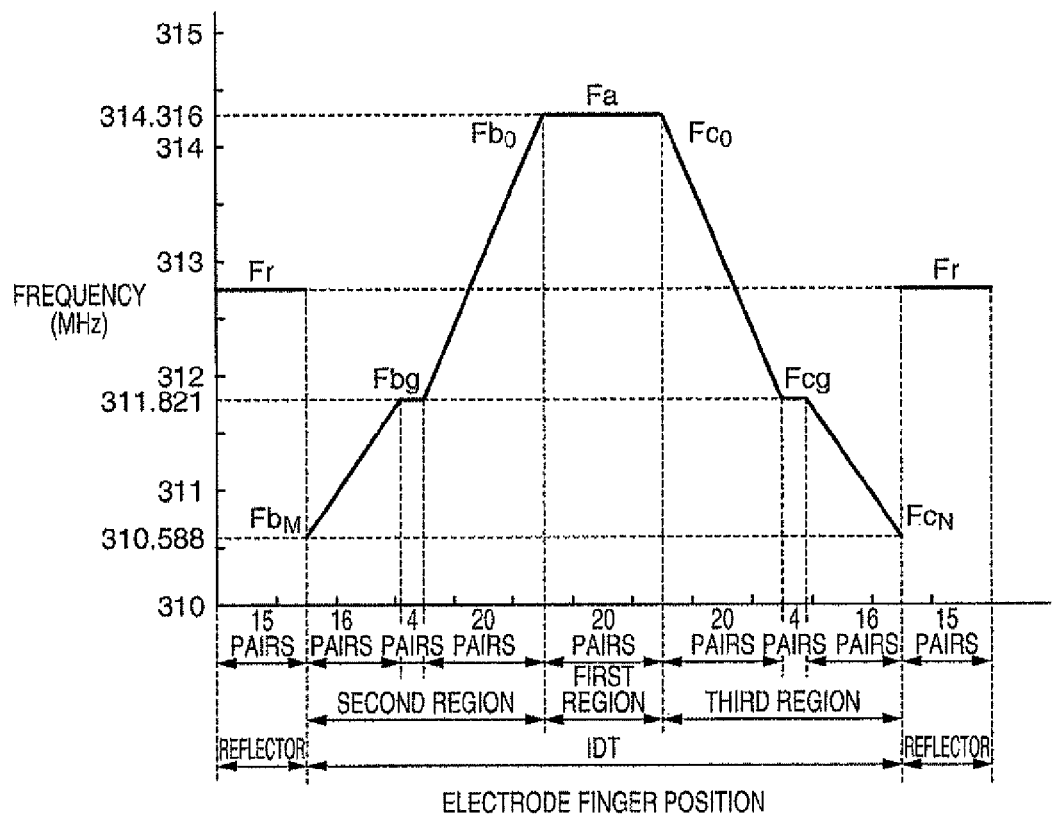
FIG. 24 is a diagram illustrating the relation between the electrode finger position and the frequency in Modification 5.

FIG. 24 is a graph illustrating the electrode finger pitch shown in FIG. 23 in terms of a frequency.

The frequency in the first region of the IDT is fixed to Fa. The frequency in the second region varies so as to gradually decrease from a part adjacent to the first region to an edge of the IDT.

The frequency in the second region varies in the range of $Fb_0$ to $Fb_g$, the portion in which the frequency is fixed to $Fb_g$ is disposed, and the frequency subsequently varies up to $Fb_M$ to the edge of the IDT.

The frequency in the third region varies so as to gradually decrease from a part adjacent to the first region to the other edge of the IDT. The frequency in the third region varies in the range of $Fc_0$ to $Fc_g$ from the part adjacent to the first region, the portion in which the frequency is fixed to $Fc_g$ is disposed, and the frequency subsequently varies up to $Fc_N$ to the edge of the IDT.

The frequencies in the second region and the third region are set to $Fb_g=Fc_g$ and $Fb_M=Fc_N$.

The frequencies are set to Fa=314.316 MHz, $Fb_M=Fc_N$=310.588 MHz, and $Fb_f=Fc_f$=311.821 MHz.

In the surface acoustic wave resonator having the above-mentioned configuration, surface acoustic waves are excited in the IDT and the Q value as a characteristic is 15,100.

(Modification 6)

Figure 25:
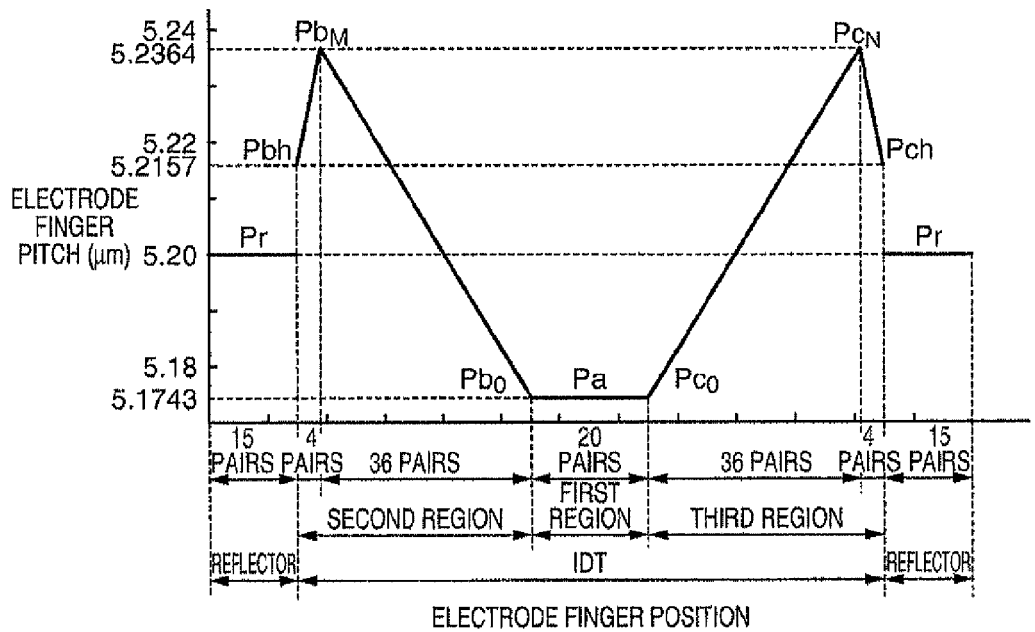
FIG. 25 is a diagram illustrating the relation between the electrode finger position and the electrode finger pitch in Modification 6.

FIG. 25 is a diagram illustrating the relation between the electrode finger position and the variation in electrode finger pitch in a surface acoustic wave resonator according to Modification 6.

Modification 6 is different from the first embodiment, in that a portion in which the electrode finger pitch gradually decreases to an edge of the IDT is disposed at the edges of the second region and the third region of the IDT.

The electrode finger pitch in the first region of the IDT is fixed to Pa. The electrode finger pitch in the second region varies in the range of $Pb_0$ to $Pb_M$ so as to gradually increase from a part adjacent to the first region to an edge of the IDT. The electrode finger pitch varies in the range of $Pb_M$ to $Pb_h$ so as to gradually decrease at the edge of the IDT.

The electrode finger pitch in the third region varies in the range of $Pc_0$ to $Pc_N$ so as to gradually increase from a part adjacent to the first region to an edge of the IDT. The electrode finger pitch varies in the range of $Pc_N$ to $Pc_h$ so as to gradually decrease at the edge of the IDT. The electrode finger pitches in the second region and the third region are set to $Pb_M=Pc_N$ and $Pb_h=Pc_h$.

The electrode finger pitch which is the distance between the centers of the neighboring electrode fingers in the reflectors is fixed to Pr.

The number of pairs of electrode fingers in the second region is set to 40 among which 4 pairs of electrode fingers are arranged in the portion in which the electrode finger pitch at the edge gradually decreases. The number of pairs of electrode fingers in the third region is set to 40 among which 4 pairs of electrode fingers are arranged in the portion in which the electrode finger pitch at the edge gradually decreases. The number of pairs of electrode fingers in the first region is set to 20. That is, the total number of pairs of electrode fingers in the IDT is set to 100. The number of pairs of electrode fingers in each of the right and left reflectors is set to 15.

The electrode finger pitches are set to Pa=5.1743 μm, $Pb_M=Pc_N$=5.2364 μm, $Pb_h=Pc_h$=5.2157 μm, and Pr=5.2003 μm.

Figure 26:
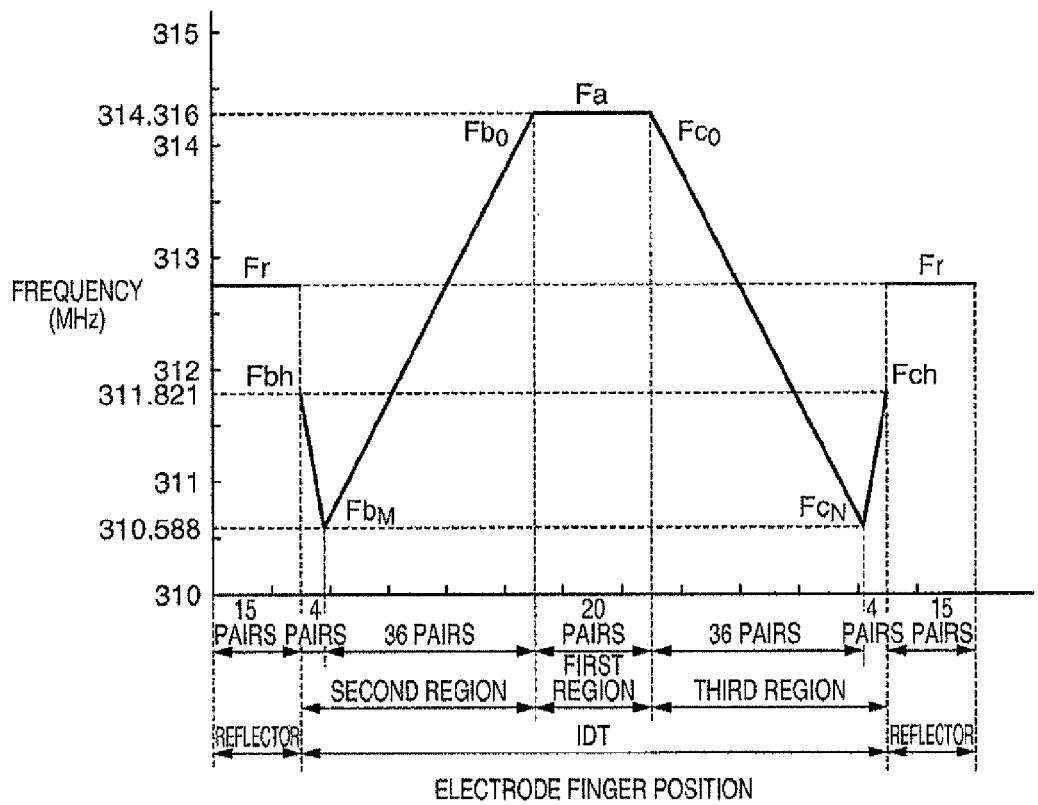
FIG. 26 is a diagram illustrating the relation between the electrode finger position and the frequency in Modification 6.

FIG. 26 is a graph illustrating the electrode finger pitch shown in FIG. 25 in terms of a frequency.

The frequency in the first region of the IDT is fixed to Fa. The frequency in the second region varies so as to gradually decrease from a part adjacent to the first region to an edge of the IDT.

The frequency in the second region varies in the range of $Fb_0$ to $Fb_M$ to gradually decrease and the frequency at an edge of the IDT varies in the range of $Fb_M$ to $Fb_h$ to gradually increase.

The frequency in the third region varies in the range of $Fc_0$ to $Fc_N$ to gradually decrease and the frequency at the other edge of the IDT varies in the range of $Fc_N$ to $Fc_h$ to gradually increase.

The frequencies are set to Fa=314.316 MHz, $Fb_M=Fc_N$=310.588 MHz, and $Fb_h=Fc_h$=311.821 MHz.

In the surface acoustic wave resonator having the above-mentioned configuration, surface acoustic waves are excited in the IDT and the Q value as a characteristic is 17,800.

(Modification 7)

Figure 27:
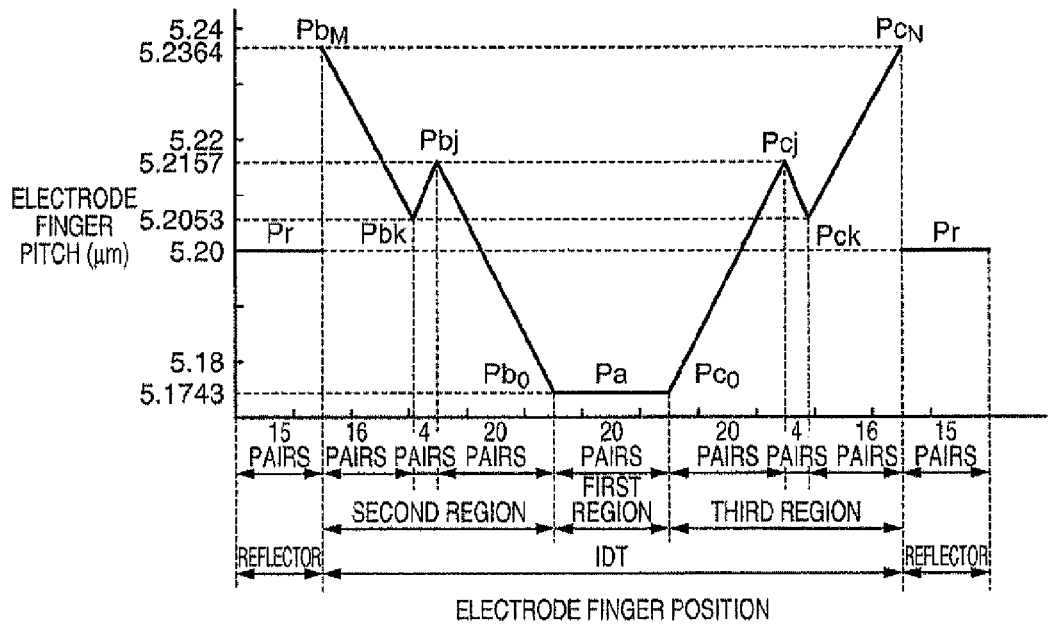
FIG. 27 is a diagram illustrating the relation between the electrode finger position and the electrode finger pitch in Modification 7.

FIG. 27 is a diagram illustrating the relation between the electrode finger position and the variation in electrode finger pitch in a surface acoustic wave resonator according to Modification 7.

Modification 7 is different from the first embodiment, in that a portion in which the electrode finger pitch gradually decreases to an edge of the IDT is disposed in the second region and the third region of the IDT.

The electrode finger pitch in the first region of the IDT is fixed to Pa. The electrode finger pitch in the second region varies in the range of $Pb_0$ to $Pb_j$ so as to gradually increase from a part adjacent to the first region to an edge of the IDT and then varies in the range of $Pb_j$ to $Pb_k$ so as to gradually decrease. Then, the electrode finger pitch varies in the range of $Pb_k$ to $Pb_M$ so as to gradually decrease to the edge of the IDT.

The electrode finger pitch in the third region varies in the range of $Pc_0$ to $Pc_j$ so as to gradually increase from a part adjacent to the first region to the other edge of the IDT and then varies in the range of $Pc_j$ to $Pc_k$ so as to gradually decrease. Then, the electrode finger pitch varies in the range of $Pc_k$ so as to $Pc_N$ to gradually decrease to the other edge of the IDT.

The electrode finger pitches in the second region and the third region are set to $Pb_M=Pc_N$ and $Pb_j=Pc_j$, and $Pb_k=Pc_K$.

The electrode finger pitch which is the distance between the centers of the neighboring electrode fingers in the reflectors is fixed to Pr.

The number of pairs of electrode fingers in the second region is set to 40 among which 4 pairs of electrode fingers are arranged in the portion in which the electrode finger pitch gradually decreases. The number of pairs of electrode fingers in the third region is set to 40 among which 4 pairs of electrode fingers are arranged in the portion in which the electrode finger pitch gradually decreases. The number of pairs of electrode fingers in the first region is set to 20. That is, the total number of pairs of electrode fingers in the IDT is set to 100. The number of pairs of electrode fingers in each of the right and left reflectors is set to 15.

The electrode finger pitches are set to Pa=5.1743 μm, $Pb_M=Pc_N$=5.2364 μm, $Pb_j=Pc_j$=5.2157 μm, and $Pb_k=Pc_k$=5.2053 μm, Pr=5.2003 μm.

Figure 28:
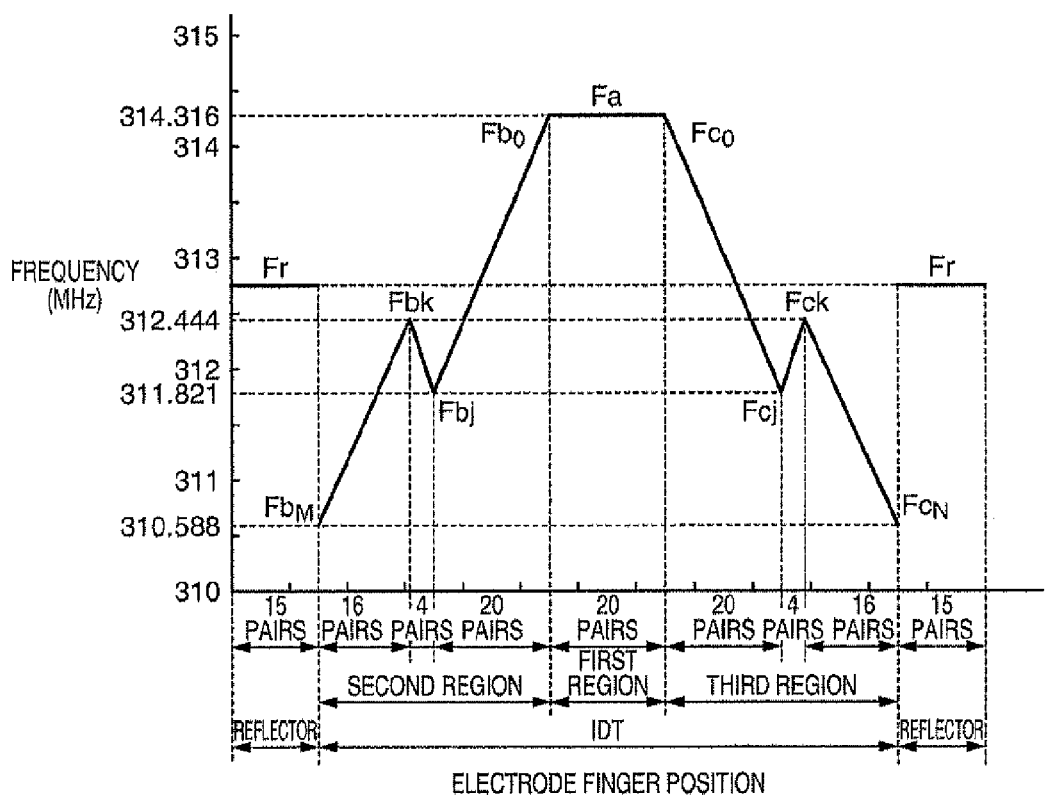
FIG. 28 is a diagram illustrating the relation between the electrode finger position and the frequency in Modification 7.

FIG. 28 is a graph illustrating the electrode finger pitch shown in FIG. 27 in terms of a frequency.

The frequency in the first region of the IDT is fixed to Fa. The frequency in the second region varies in the range of $Fb_0$ to $Fb_j$ so as to gradually decrease and then varies in the range of $Fb_j$ to $Fb_k$ so as to gradually increase. Then, the frequency varies in the range of $Fb_k$ to $Fb_M$ so as to gradually decrease to an edge of the IDT.

The frequency in the third region varies in the range of $Fc_0$ to $Fc_j$ so as to gradually decrease and then varies in the range of $Fc_j$ to $Fc_k$ so as to gradually increase. Then, the frequency varies in the range of $Fc_k$ to $Fc_N$ so as to gradually decrease to the other edge of the IDT.

The frequencies are set to Fa=314.316 MHz, $Fb_M$=$Fc_N$=310.588 MHz, $Fb_j$=$Fc_j$=311.821 MHz, and $Fb_k$=$Fc_k$=312.444 MHz.

In the surface acoustic wave resonator having the above-mentioned configuration, surface acoustic waves are excited in the IDT and the Q value as a characteristic is 15,800.

The crystal substrate with an Euler angle of (−1° to +1°, 26° to 40.7°, 85° to 95°) is used in the first embodiment and Modifications 1 to 7.

A substrate with an Euler angle of (−1° to +1°, 113° to 135°, ±(40° to 49°)) may be used as another crystal substrate. This crystal substrate is referred to as an in-plane rotating ST-cut crystal substrate and excites Rayleigh waves as surface acoustic waves.

Figure 29:
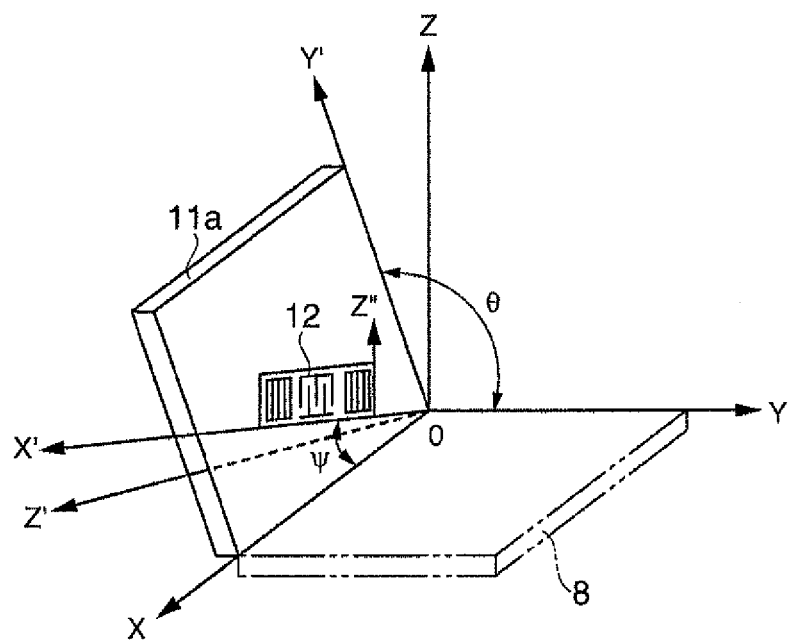
FIG. 29 is a diagram illustrating an in-plane rotating ST-cut crystal substrate.

As shown in FIG. 29, the surface acoustic wave resonator 1 employs a crystal substrate 11a obtained from the crystal Z plate 8 by setting the first rotation angle φ (not shown) to the range of −1° to +1° and setting the second rotation angle θ to the range of 113° to 135°. The IDT 12 is disposed so that the third rotation angle ψ is in the range of ±(40° to 49°). The in-plane rotating ST-cut crystal substrate has a small variation in frequency with the variation in temperature and thus has an excellent frequency-temperature characteristic.

Figure 30:
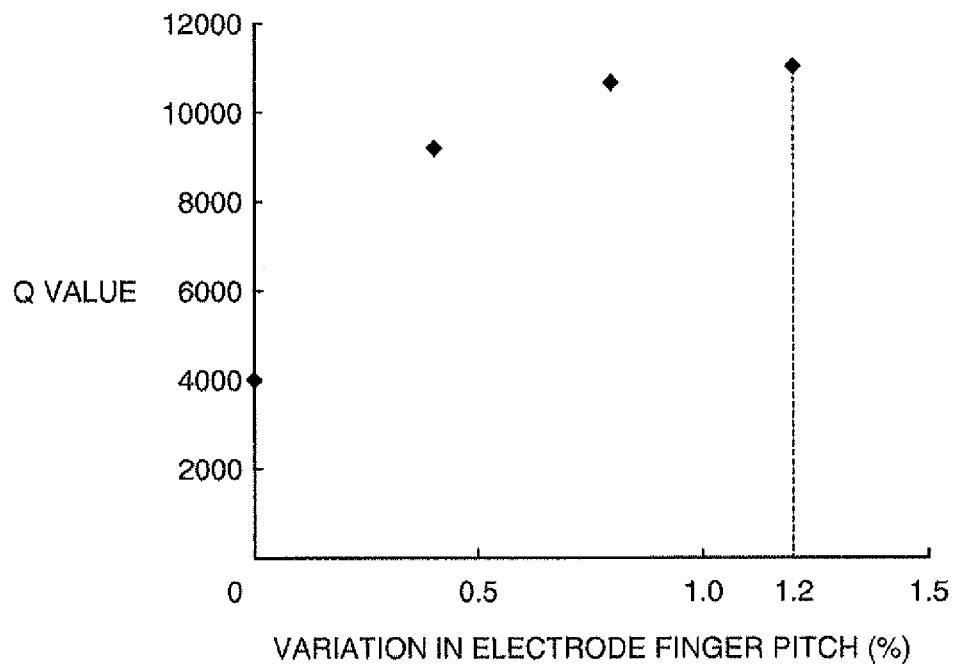
FIG. 30 is a graph illustrating the relation between the variation in electrode finger pitch and the Q value.

FIG. 30 is a graph illustrating the relation between the variation in electrode finger pitch and the Q value where an in-plane rotating ST-cut crystal substrate is used. As described with reference to FIG. 5, the variation in electrode finger pitch is a percentage of the increase in electrode finger pitch (the electrode finger pitch of a portion having the largest change) at the edges of the IDT with respect to the electrode finger pitch in the first region of the IDT.

As can be seen from the graph, the Q value increases as the variation in electrode finger pitch increases and the Q value is the greatest when the variation in electrode finger pitch is about 1.2%. By setting the variation in electrode finger pitch to be equal to or less than 1.2%, it is possible to enhance the Q value even when the in-plane rotating ST-cut crystal substrate is used.

Tables 1 and 2 show the Q values of the surface acoustic wave resonator when the Euler angle of the crystal substrate is variously changed. Table 1 is based on the comparative example where the electrode finger pitch is fixed all over the ITT and Table 2 is based on the first embodiment of the invention.

The IDT 12 and the reflectors 13 are formed of aluminum (Al) which is a metal material, and the thickness thereof is set to 0.06λ (where λ is the wavelength of surface acoustic waves). Regarding the line occupying ratio η, the line occupying ratio is set to η=0.5 when the Euler angle of the crystal substrate is in the range of (−1° to +1°, 26° to 40.7°, 85° to 95°) and the line occupying ratio is set to η=0.4 when the Euler angle of the crystal substrate is in the range of (−1° to +1°, 113° to 135°, ±(40° to) 49°).

TABLE 1

| Euler angle | | | IDT | | | | | | reflector | | |
|---|---|---|---|---|---|---|---|---|---|---|---|
| φ [°] | θ [°] | ψ [°] | total number of pairs in IDT | number of pairs in first region | number of pairs in second region (=number of pairs in third region) | pa [μm] | $Pb_M$ (=$Pc_N$) [μm] | $Pb_M$/Pa (=$Pc_N$/Pa) | number of pairs | Lt/Lr | Q |
| 0 | 38.5 | 90 | 100 | 100 | 0 | 5.1743 | 5.1743 | 1 | 15 | 0.995 | 5800 |
|  | 26 | 85 |  |  |  |  |  |  |  |  | 4651 |
|  |  | 95 |  |  |  |  |  |  |  |  | 4651 |
|  | 40.7 | 85 |  |  |  |  |  |  |  |  | 6197 |
|  |  | 95 |  |  |  |  |  |  |  |  | 6197 |
|  | 33.35 | 90 |  |  |  |  |  |  |  |  | 5184 |
| −1 | 26 | 85 |  |  |  |  |  |  |  |  | 3988 |
|  |  | 95 |  |  |  |  |  |  |  |  | 4802 |
|  | 40.7 | 85 |  |  |  |  |  |  |  |  | 5958 |
|  |  | 95 |  |  |  |  |  |  |  |  | 5758 |
| 1 | 26 | 85 |  |  |  |  |  |  |  |  | 4802 |
|  |  | 95 |  |  |  |  |  |  |  |  | 3988 |
|  | 40.7 | 85 |  |  |  |  |  |  |  |  | 5758 |
|  |  | 95 |  |  |  |  |  |  |  |  | 5958 |
| −1 | 113 | 40 | 80 | 80 |  |  |  |  | 50 | 0.99 | 4458 |
|  |  | 49 |  |  |  |  |  |  |  |  | 3070 |
|  | 135 | 40 |  |  |  |  |  |  |  |  | 4257 |
|  |  | 49 |  |  |  |  |  |  |  |  | 25877 |
| 1 | 113 | 40 |  |  |  |  |  |  |  |  | 7364 |
|  |  | 49 |  |  |  |  |  |  |  |  | 2654 |
|  | 135 | 40 |  |  |  |  |  |  |  |  | 2479 |
|  |  | 49 |  |  |  |  |  |  |  |  | 21767 |
| 0 | 124 | 44.5 |  |  |  |  |  |  |  |  | 7246 |

TABLE 2

| Euler angle | | | IDT | | | | | | reflector | | |
|---|---|---|---|---|---|---|---|---|---|---|---|
| φ [°] | θ [°] | ψ [°] | total number of pairs in IDT | number of pairs in first region | number of pairs in second region (=number of pairs in third region) | pa [μm] | $Pb_M$ (=$Pc_N$) [μm] | $Pb_M$/Pa (=$Pc_N$/Pa) | number of pairs | Lt/Lr | Q |
| 0 | 38.5 | 90 | 100 | 20 | 40 | 5.1743 | 5.2364 | 1.012 | 15 | 0.995 | 17025 |
|  | 26 | 85 |  |  |  |  |  |  |  |  | 16667 |
|  |  | 95 |  |  |  |  |  |  |  |  | 16667 |
|  | 40.7 | 85 |  |  |  |  |  |  |  |  | 20365 |
|  |  | 95 |  |  |  |  |  |  |  |  | 20365 |
|  | 33.35 | 90 |  |  |  |  |  |  |  |  | 16429 |
| −1 | 26 | 85 |  |  |  |  |  |  |  |  | 14279 |
|  |  | 95 |  |  |  |  |  |  |  |  | 18490 |
|  | 40.7 | 85 |  |  |  |  |  |  |  |  | 21091 |
|  |  | 95 |  |  |  |  |  |  |  |  | 19703 |
| 1 | 26 | 85 |  |  |  |  |  |  |  |  | 18490 |
|  |  | 95 |  |  |  |  |  |  |  |  | 14279 |
|  | 40.7 | 85 |  |  |  |  |  |  |  |  | 19703 |
|  |  | 95 |  |  |  |  |  |  |  |  | 21091 |
| −1 | 113 | 40 | 80 | 30 |  |  |  |  | 50 | 0.99 | 6562 |
|  |  | 49 |  |  |  |  |  |  |  |  | 4021 |
|  | 135 | 40 |  |  |  |  |  |  |  |  | 5606 |
|  |  | 49 |  |  |  |  |  |  |  |  | 31263 |
| 1 | 113 | 40 |  |  |  |  |  |  |  |  | 10559 |
|  |  | 49 |  |  |  |  |  |  |  |  | 3443 |
|  | 135 | 40 |  |  |  |  |  |  |  |  | 3125 |
|  |  | 49 |  |  |  |  |  |  |  |  | 26485 |
| 0 | 124 | 44.5 |  |  |  |  |  |  |  |  | 9447 |

Comparing Tables 1 and 2, it can be clearly seen that the surface acoustic wave resonator according to this embodiment can realize a Q value higher than that of the surface acoustic wave resonator in which the electrode finger pitch is fixed all over the IDT.

Rayleigh waves are excited when the Euler angle of the crystal substrate is in the range of (−1° to +1°, 113° to 135°, ±(40° to) 49°) and SH waves are excited when the Euler angle of the crystal substrate is in the range of (−1° to +1°, 26° to 40.7°, 85° to 95'). However, it can be seen that the advantages of this embodiment can be obtained regardless of the types of the surface acoustic waves.

It has been confirmed that the advantages of this embodiment can be obtained when the Euler angle of the crystal substrate is in other ranges, as well as when the Euler angle of the crystal substrate is in the range of (−1° to +1°, 113° to 135°, ±(40° to) 49°) and when the Euler angle of the crystal substrate is in the range of (−1° to +1°, 26° to 40.7°, 85° to 95').

Second Embodiment

A surface acoustic wave resonator according to a second embodiment of the invention will be described below.

In this embodiment, the line occupying ratio of electrode fingers is set to be greater as means for setting the frequency at the edges of the IDT to be lower than the frequency in the first region.

Figure 31:
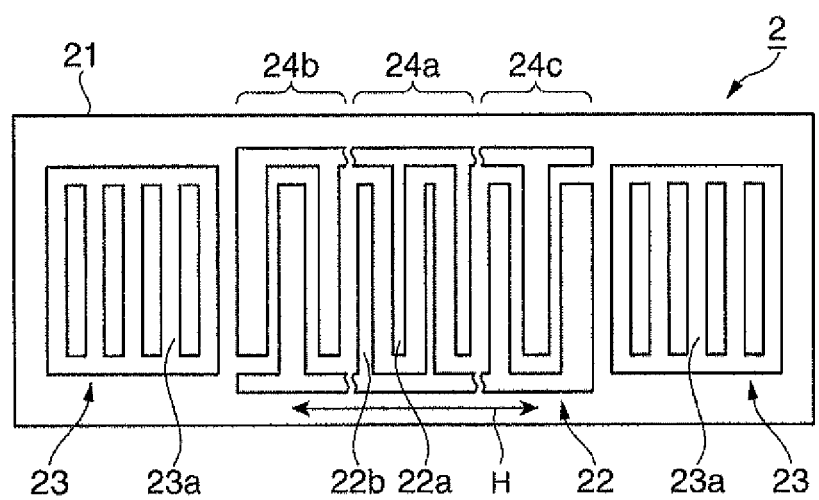
FIG. 31 is a plan view schematically illustrating the configuration of a surface acoustic wave resonator according to a second embodiment of the invention.
Figure 32:
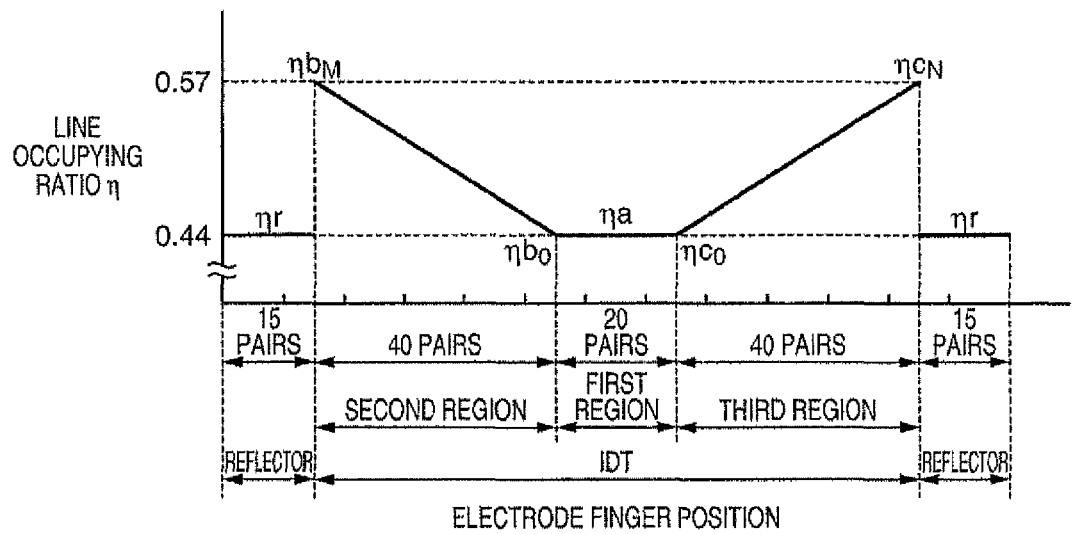
FIG. 32 is a diagram illustrating the relation between the electrode finger position and the line occupying ratio in the surface acoustic wave resonator according to the second embodiment.
Figure 33:
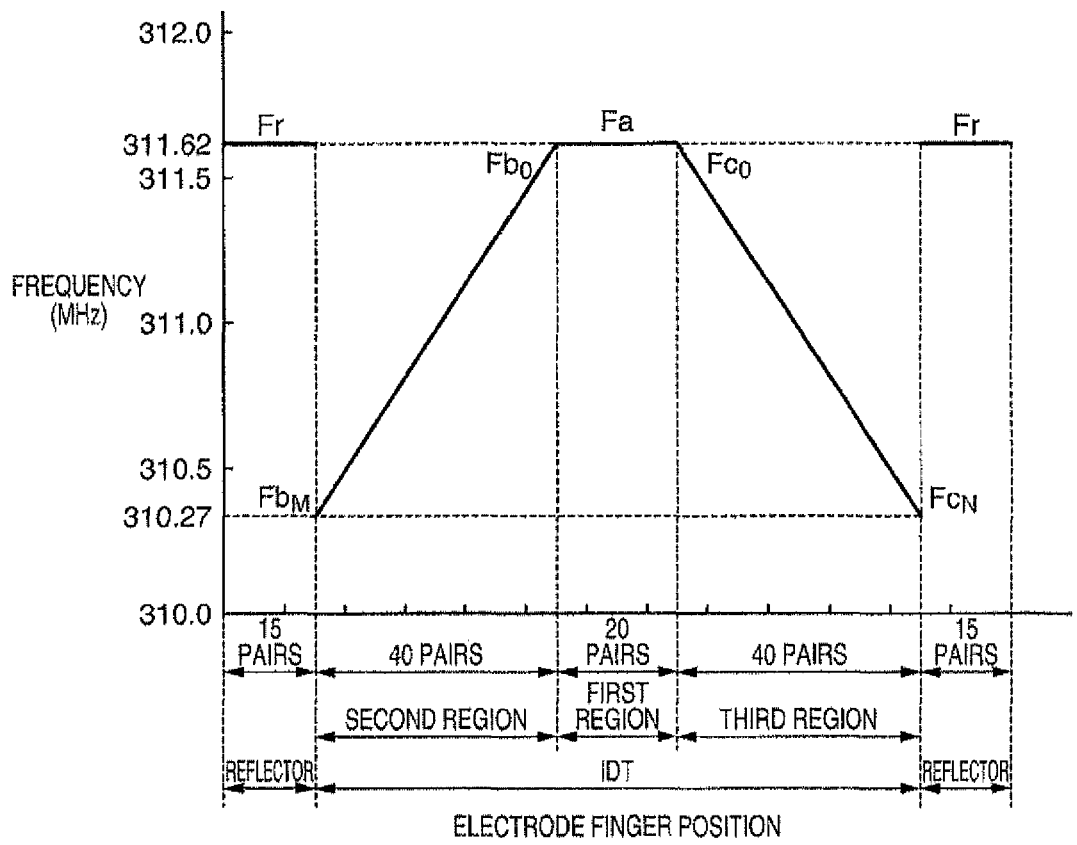
FIG. 33 is a diagram illustrating the relation between the line occupying ratio and the frequency in the surface acoustic wave resonator according to the second embodiment.
Figure 34:
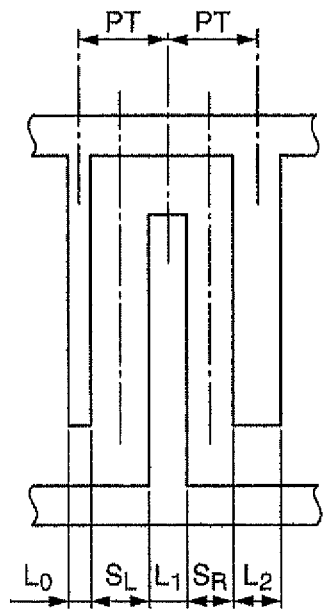
FIG. 34 is a diagram schematically illustrating the line occupying ratio.

FIG. 31 is a plan view schematically illustrating the configuration of a surface acoustic wave resonator according to a second embodiment of the invention. FIG. 32 is a diagram illustrating the relation between the electrode finger position and the line occupying ratio in the surface acoustic wave resonator according to the second embodiment. FIG. 33 is a diagram illustrating the relation between the electrode finger position and the frequency in the surface acoustic wave resonator according to the second embodiment. FIG. 34 is a diagram schematically illustrating the line occupying ratio.

As shown in FIG. 31, the surface acoustic wave resonator 2 includes an IDT 22 having a comb-like electrode and a pair of reflectors 23 disposed with the IDT 22 interposed therebetween in the direction in which surface acoustic waves travel, on a crystal substrate 21 as a piezoelectric substrate.

When a cut face and a surface acoustic wave traveling direction are expressed by the Euler angle (φ, θ, ψ), the crystal substrate 21 is a crystal substrate with an Euler angle of (−1° to +1°, 26° to 40.7°, 85° to 95').

In the IDT 22, electrode fingers 22a and 22b are alternately arranged so as to have different electrical polarities. The electrode pitch in the IDT 22 is set to be even. In this embodiment, two neighboring electrode fingers 22a and 22b are counted as a pair of electrodes.

As shown in FIGS. 31 and 32, the IDT 22 is divided into three regions of a first region 24a at the center thereof and a second region 24b and a third region 24c on both sides thereof. The number of pairs of electrode fingers in the first region 24a is set to 20, the number of pairs of electrode fingers in the second region 24b is set to 40, and the number of pairs of electrode fingers in the third region 24c is set to 40. That is, the total number of pairs of electrode fingers in the IDT 22 is set to 100.

A ratio of electrode fingers occupying the IDT 22 and the reflectors 23 in the surface acoustic wave traveling direction is referred to as a line occupying ratio η.

As shown in FIG. 32, the line occupying ratio in the first region 24a is fixed to ηa. The line occupying ratio in the second region 24b varies in the range of $\eta b_0$ to $\eta b_M$. The line occupying ratio in the second region 24b varies so as to gradually increase from a part adjacent to the first region 24a to an edge of the IDT 22. The line occupying ratio in the third region 24c varies in the range of $\eta c_0$ to $\eta c_N$. The line occupying ratio in the third region 24c varies so as to gradually increase from a part adjacent to the first region 24a to the other edge of the TOT 22.

The method of calculating a line occupying ratio when the neighboring electrode fingers have the same line occupying ratio is the same as described with reference to FIG. 40 like the first region 24a.

Like the second region 24b and the third region 24c, when the neighboring electrode fingers have different line occupying ratios, the sizes of the neighboring spaces are different from each other and thus the line occupying ratios are calculated as follows.

As shown in FIG. 34, the line widths of neighboring electrode fingers are represented by $L_0$, $L_1$, and $L_2$, the distances between the neighboring electrode fingers (a space in which no electrode finger is formed) are represented by $S_L$ and $S_R$, and the distance between the neighboring electrode fingers is represented by PT. The electrode finger pitch is calculated as $PT=S_L+1/2(L_0+L_1)$ or $PT=S_R+1/2(L_1+L_2)$ and the line occupying ratio of the electrode finger at the center is calculated as $\eta=L_1/(L_1+1/2(S_L+S_R))$. In the reflectors 23, plural electrode fingers 23a are arranged to be electrically neutral. The line occupying ratio of the electrode fingers 23a is fixed to $\eta r$.

In the reflectors 23, two neighboring electrode fingers 23a are counted as a pair of electrodes and 15 pairs of electrode fingers 23a are arranged on each reflector in this embodiment.

The IDT 22 and the reflectors 23 are formed of aluminum (Al) as a metal material and the thickness thereof is set to 0.06λ (where λ is the wavelength of a surface acoustic wave). The line occupying ratios are set to $\eta a=0.44$, $\eta b_M=\eta c_N=0.57$, and $\eta r=0.57$.

FIG. 33 is a graph illustrating the electrode finger pitch shown in FIG. 32 in terms of a frequency.

The frequency in the first region 24a of the IDT 22 is fixed to Fa. The frequency in the second region 24b varies in the range of $Pb_0$ to $Pb_5$. The frequency in the second region 24b varies so as to gradually decrease from a part adjacent to the first region 24a to an edge of the IDT 22. The frequency in the third region 24c varies in the range of $Fc_0$ to $Fc_N$. The frequency in the third region 24c varies so as to gradually decrease from a part adjacent to the first region 24a to the other edge of the IDT 22.

The frequencies are set to Fa=311.620 MHz, $Fb_M=Fc_N=310.270$ MHz.

The characteristics of the surface acoustic wave resonator according to this embodiment will be described in detail below.

Figure 35:
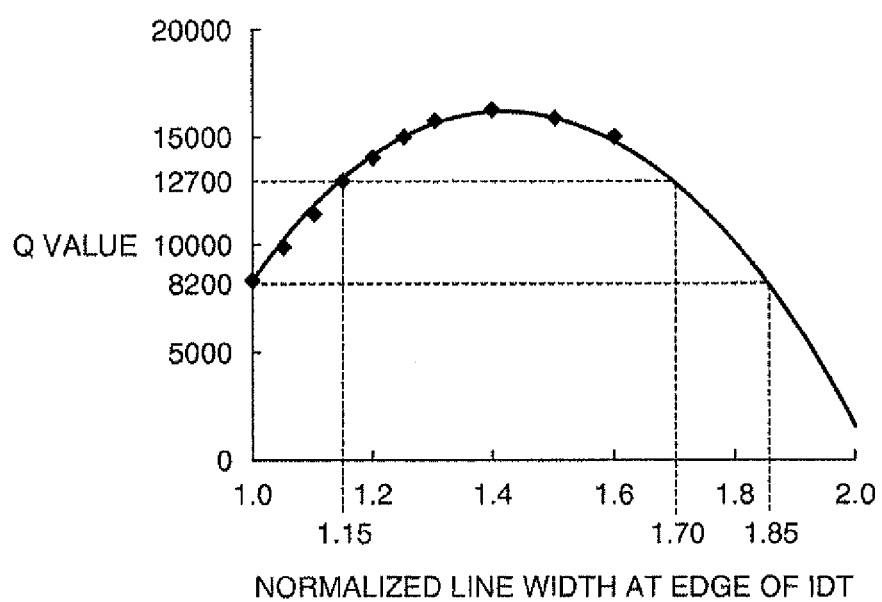
FIG. 35 is a graph illustrating the relation between a normalized line width of the electrode fingers at the edges of the IDT and the Q value.

FIG. 35 is a graph illustrating the relation between the normalized line width of the electrode fingers at the edges of the IDT and the Q value. The normalized line width of the electrode fingers is a ratio of the line width of the electrode fingers at the edges of the IDT to the line width of the electrode fingers in the first region of the IDT. That is, the normalized line width is a value obtained by dividing the line width of the electrode fingers at the edges of the IDT by the line width of the electrode fingers in the first region of the IDT.

When the electrode finger pitch is fixed, this value is the same as the ratios ($\eta b_M/\eta a$ and $\eta c_N/\eta a$) of the line occupying ratios.

The Q value increases as the normalized line width increases, the Q value is the maximum when the normalized line width is about 1.4, and the Q value decreases as the normalized line width further increases.

As can be seen from this graph, it is possible to change the normalized line width and thus to enhance the Q value, when the normalized line width (the ratios of the line occupying ratios ($\eta b_M/\eta a$ and $\eta c_N/\eta a$)) is equal to or less than 1.85. It is possible to obtain a Q value greater than 12,700 which is the Q value of the conventional surface acoustic wave resonator 110, when the normalized line width (the ratios of the line occupying ratios ($\eta b_M/\eta a$ and $\eta c_N/\eta a$)) is greater than 1.15 and equal to or less than 1.70.

Figure 36:
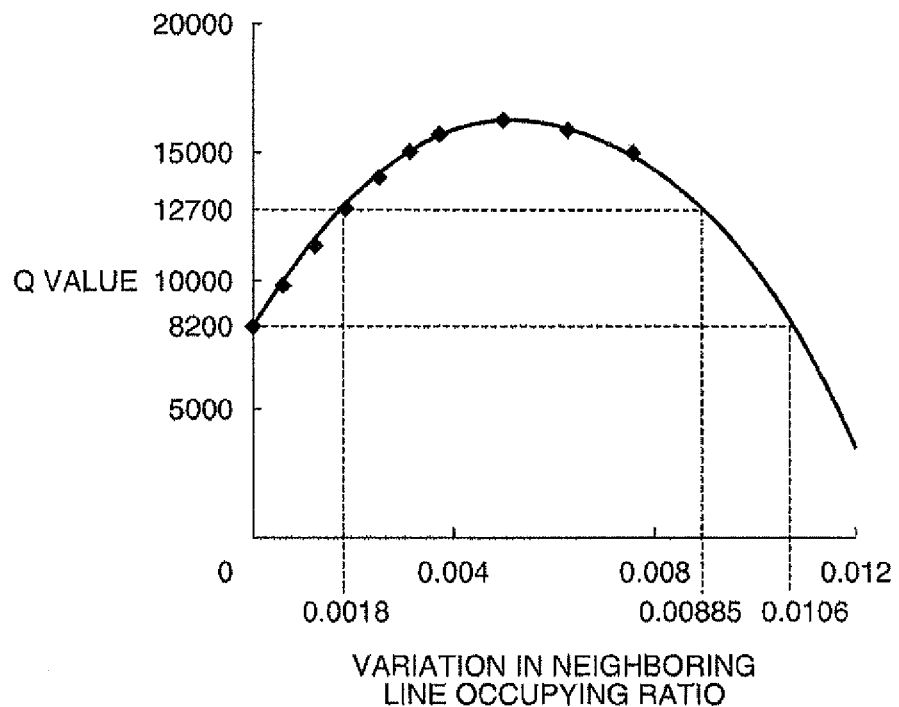
FIG. 36 is a graph illustrating the relation between the variation in line occupying ratio in the neighboring electrode fingers and the Q value.

FIG. 36 is a graph illustrating the relation between the variation in line occupying ratio of the neighboring electrode fingers and the Q value.

When the line occupying ratio at a position in the second region is $\eta b_m$ and the line occupying ratio at a position adjacent thereto is $\eta b_{m+1}$, the variation in line occupying ratio at the neighboring positions is expressed by $|\eta b_{m+1}-\eta b_m|/\eta b_m$. When the line occupying ratio at a position in the third region is $\eta c_n$ and the line occupying ratio at a position adjacent thereto is $\eta c_{n+1}$, the variation in line occupying ratio at the neighboring positions is expressed by $|\eta c_{n+1}-\eta c_n|/\eta c_n$.

As can be seen from this graph, the Q value increases as the variation in line occupying ratio at the neighboring positions increases, the Q value is the maximum when the variation in line occupying ratio is about 0.005, and the Q value decreases as the variation in line occupying ratio further increases.

It can be seen that it is possible to enhance the Q value by changing the line occupying ratio when the variation in line occupying ratio at the neighboring positions is equal to or less than 0.0106. When the variation in line occupying ratio at the neighboring positions is in the range of $0.0018<|\eta b_{m+1}-\eta b_m|/\eta b_m<0.00885$ and $0.0018<|\eta c_{n+1}-\eta c_n|/\eta c_n<0.00885$, the Q value is greater than that of the conventional surface acoustic wave resonator 100, thereby guaranteeing a value of 12,700.

As described above, in the IDT 22 of the surface acoustic wave resonator 2 according to this embodiment, the frequency is fixed in the first region 24a disposed at the center and the second region 24b and the third region 24c have a portion in which the frequency gradually decreases as it approaches the edges. The periodic structure having the same line occupying ratio is employed for the first region 24a so as to keep the frequency constant, and a structure in which the line occupying ratio gradually increases to the edges is employed for the second region 24b and the third region 24c so as to decrease the frequency at the edges.

In this way, since the vibration displacement in the first region 24a at the center of the IDT 22 can be maintained to be great and the reflection of surface acoustic waves in the second region 24b and the third region 24c at both edges of the IDT 22 can be made to increase, it is possible to enhance the confinement of vibration energy in the IDT 22, thereby enhancing the Q value.

In the first and second embodiments, aluminum (Al) is used as the electrode material of the IDT and the reflectors, but the same advantages can be obtained from an aluminum alloy. Examples of the electrode material other than aluminum include gold (Au), silver (Ag), copper (Cu), tungsten (W), tantalum (Ta), and alloys containing any thereof as a main component.

Although it has been described in the first and second that the electrode thickness of the IDT is set to 0.06λ (where λ is the wavelength of the surface acoustic waves), it has been confirmed that the same advantages can be obtained with an electrode thickness other than 0.067.

Although it has been described in the first embodiment that the lined with of the electrode fingers is set to 0.25λ, the line width of the electrode fingers may be set to other values. In this case, the same advantages can be obtained.

Although the electrode finger pitch weighting and the line occupying ratio weighting have been described as specific examples of the frequency weighting of the IDT in the first and second embodiments, a weighting using an electrode finger thickness or an inter-electrode-finger groove depth may be used. In the weighting using the electrode finger thickness and the weighting using the thickness of a protective film formed on the electrode fingers, the thickness can be made to increase from the center to the edges of the IDT. The protective film may be formed of silicon oxide ($SiO_2$), silicon nitride ($Si_3N_4$), alumina, or the like. In the weighting using the inter-electrode-finger groove depth, a groove can be formed to become deeper from the center to the edges of the IDT by etching the crystal substrate.

Although it has been described in the first and second embodiments that the reflectors are disposed on both sides of the IDT, the same advantages can be obtained without employing the reflectors.

Third Embodiment

A surface acoustic wave oscillator in which the above-mentioned surface acoustic wave resonator is mounted on a package may be constructed.

Figure 37:
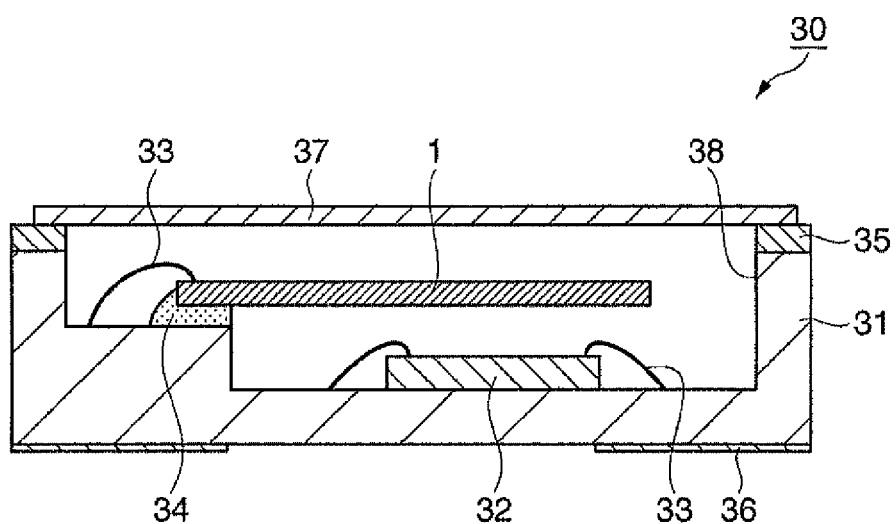
FIG. 37 is a sectional view schematically illustrating a surface acoustic wave oscillator according to the second embodiment of the invention.

FIG. 37 is a sectional view schematically illustrating a surface acoustic wave oscillator in which a surface acoustic wave resonator is mounted on a package.

The surface acoustic wave oscillator 30 includes a ceramic package 31, an IC chip 32, a surface acoustic wave resonator 1, and a lid member 37.

The ceramic package 31 includes a concave section 38 formed by stacking and then opening ceramic sheets. A seam ring 35 formed of a metal material such as Kovar to surround the opening is disposed in the ceramic package 31. An external connection electrode 36 for connection to an external device such as a circuit board is formed on the outer circumference of the ceramic package 31. Although not shown, an interconnection connecting the external connection electrode 36 to the concave section 38 of the ceramic package 31 is provided.

The IC chip 32 as a circuit element is fixed to the bottom surface of the concave section 38 of the ceramic package 31 and is mounted thereon via a metal wire such as a gold wire. The IC chip 32 includes an oscillation circuit exciting the surface acoustic wave resonator 1 and may further include a temperature compensating circuit and a voltage control circuit. The surface acoustic wave resonator 1 is fixed to a platform portion of the concave section 38 of the ceramic package 31 with an adhesive 34. A pad is connected to the IDT with a metal wire 33.

The lid member 37 formed of a metal material such as Kovar is disposed above the concave section 38 of the ceramic package 31. The inside of the concave section 38 of the ceramic package 31 is air-tightly sealed by seam-welding the seam ring 35 to the lid member 37.

In this way, since the surface acoustic wave resonator 1 with an increased Q value and a decreased CI value is mounted on the ceramic package 31, it is possible to provide a surface acoustic wave oscillator 30 in which the excitation of surface acoustic waves is stabilized and the power consumption is lowered.

Fourth Embodiment

A surface acoustic wave module unit mounted with the surface acoustic wave resonator can be constructed.

Figure 38:
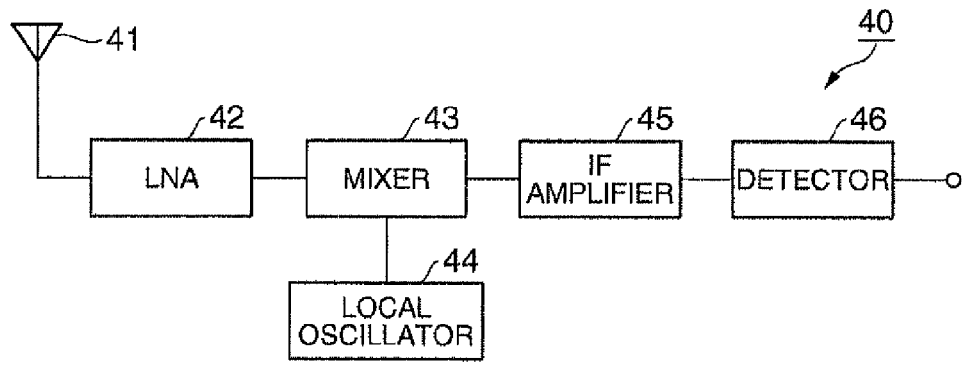
FIG. 38 is a circuit block diagram illustrating a receiver module mounted with a surface acoustic wave resonator according to a third embodiment of the invention.

FIG. 38 is a circuit block diagram illustrating an example of a surface acoustic wave module unit in which the surface acoustic wave resonator is mounted on a circuit board to form a receiver module.

The receiver module 40 includes a receiver antenna 41, a low noise amplifier (LNA) 42, a mixer 43, a local oscillator 44, an intermediate frequency (IF) amplifier 45, and a detector 46.

The receiver antenna 41 is connected to an input of the mixer 43 via the LNA 42. The local oscillator 44 is also connected to the input of the mixer 43. The local oscillator includes a surface acoustic wave resonator and an oscillation circuit exciting the surface acoustic wave resonator. Accordingly, the local oscillator 44 can satisfactorily output a frequency signal to the mixer 43. The IF amplifier 45 and the detector 46 are connected in series to the output of the mixer 43.

A signal transmitted from a transmitter as the opposite party is input to the LNA 42 via the receiver antenna 41, is amplified by the LNA 42, and is then input to the mixer 43. The mixer 43 receives the frequency signal from the local oscillator 44 and down-converts and outputs the signal input from the LNA 42. The down-converted signal is amplified by the IF amplifier 45 and then is input to and detected by the detector 46. By employing this configuration, the receiver module 40 can receive the signal transmitted from the transmitter. Since the receiver module 40 includes the surface acoustic wave resonator disposed in the local oscillator 44, it is possible to provide a receiver module which can stably receive a signal and has low power consumption.

The receiver module may be mounted on an outer package and the like to form an electronic apparatus.

This application claims the benefit of Japanese Patent Application No. 2008-273969 filed Oct. 24, 2008 and PCT International Application No. PCT/JP2009/005539 filed Oct. 22, 2009, which are hereby incorporated by reference herein in their entirety.

| | Reference Signs List |
|---|---|
| 1, 2: | SURFACE ACOUSTIC WAVE RESONATOR |
| 8: | CRYSTAL Z-PLATE |
| 11: | CRYSTAL SUBSTRATE |
| 12: | IDT |
| 12a, 12b: | ELECTRODE FINGER OF IDT |
| 13: | REFLECTOR |
| 13a: | ELECTRODE FINGER OF REFLECTOR |
| 14a: | FIRST REGION |
| 14b: | SECOND REGION |
| 14c: | THIRD REGION |
| 21: | CRYSTAL SUBSTRATE |
| 22: | IDT |
| 22a, 22b: | ELECTRODE FINGER OF IDT |
| 23: | REFLECTOR |
| 23a: | ELECTRODE FINGER OF REFLECTOR |
| 24a: | FIRST REGION |
| 24b: | SECOND REGION |
| 24c: | THIRD REGION |
| 30: | SURFACE ACOUSTIC WAVE OSCILLATOR |
| 31: | CERAMIC PACKAGE |
| 32: | IC CHIP |
| 33: | METAL WIRE |
| 34: | ADHESIVE |
| 35: | SEAM RING |
| 36: | EXTERNAL CONNECTION ELECTRODE |
| 37: | LID MEMBER |
| 40: | RECEIVER MODULE |
| 41: | RECEIVER ANTENNA |
| 42: | LOW NOISE AMPLIFIER (LNA) |

| | Reference Signs List |
|---|---|
| 43: | MIXER |
| 44: | LOCAL OSCILLATOR |
| 45: | INTERMEDIATE FREQUENCY (IF) AMPLIFIER |
| 46: | DETECTOR |

The invention claimed is:

1. A surface acoustic wave resonator comprising:
a crystal substrate in which Euler angles are within a range of $$(-1° \leq \phi \leq +1°, 113° \leq \theta \leq 135°, 40° \leq |\psi| \leq 49°);$$

an interdigital transducer having electrode fingers for exciting surface acoustic waves on the crystal substrate;
a first region disposed at a center of the interdigital transducer;
a second region and a third region arranged so as to sandwich the first region along a propagation direction of the surface acoustic waves, wherein
a frequency being fixed in the first region and a portion in which a frequency gradually decreases as it approaches the edge of the interdigital transducer along the direction in which the surface acoustic waves propagate from a part adjacent to the first region is disposed in the second region and the third region, and
when the frequency of the first region is Fa, the frequency at an edge of the second region on the opposite side of the first region along the direction in which the surface acoustic waves propagate is $Fb_M$, and the frequency at an edge of the third region on the opposite side of the first region along the direction in which the surface acoustic waves propagate is $Fc_N$, the variations in frequency at the edges are in the ranges of $0.9815 < Fb_M/Fa < 0.9953$ and $0.9815 < Fc_N/Fa < 0.9953$, respectively.

2. The surface acoustic wave resonator according to claim 1, wherein the variations in frequency are in the ranges of $0.9865 \leq Fb_M/Fa \leq 0.9920$ and $0.9865 \leq Fc_N/Fa \leq 0.9920$, respectively.

3. The surface acoustic wave resonator according to claim 1, wherein when the frequency at a position in the second region is $Fb_m$, the frequency at a position adjacent thereto is $Fb_{m+1}$, the frequency at a position in the third region is $Fc_n$, and the frequency at a position adjacent thereto is $Fc_{n+1}$, the variations in frequency at neighboring positions in the portion in which the frequency gradually decreases are in the ranges of $0 < |Fb_{m+1} - Fb_m|/Fb_m < 0.000225$ and $0 < |Fc_{n+1} - Fc_n|/Fc_n < 0.000225$, respectively.

4. The surface acoustic wave resonator according to claim 1, wherein an electrode finger pitch between centers of two neighboring electrode fingers in the first region is fixed,
wherein the electrode finger pitch in the second region is set to be greater than the electrode finger pitch in the first region and to gradually increase from a part adjacent to the first region to an edge of the second region,
wherein the electrode finger pitch in the third region is set to be greater than the electrode finger pitch in the first region and to gradually increase from a part adjacent to the first region to an edge of the third region, and
wherein when the electrode finger pitch in the first region is Pa, the electrode finger pitch at the edge of the second region is $Pb_M$, and the electrode finger pitch at the edge of the third region is $Pc_N$, the variations in electrode finger pitch at the edges are in the ranges of $1.0047 < Pb_M/Pa < 1.0188$ and $1.0047 < Pc_N/Pa < 1.0188$, respectively.

5. The surface acoustic wave resonator according to claim 4, wherein the variations in electrode finger pitch at the edges are in the ranges of $1.0081 \leq Pb_M/Pa \leq 1.0137$ and $1.0081 \leq Pc_N/Pa \leq 1.0137$, respectively.

6. The surface acoustic wave resonator according to claim 4, wherein when the electrode finger pitch at a position in the second region is $Pb_m$, the electrode finger pitch at a position adjacent thereto is $Pb_{m+1}$, the electrode finger pitch at a position in the third region is $Pc_n$, and the electrode finger pitch at a position adjacent thereto is $Pc_{n+1}$, the variations in electrode finger pitch at neighboring positions are in the ranges of $0 < |Pb_{m+1} - Pb_m|/Pb_m < 0.000225$ and $0 < |Pc_{n+1} - Pc_n|/Pc_n < 0.000225$, respectively.

7. The surface acoustic wave resonator according to claim 1, wherein when the number of pairs of electrode fingers in the interdigital transducer is Ni and the number of pairs of electrode fingers in the first region of the interdigital transducer is Na, the number of pairs of electrode fingers Na in the first region is two or more and the numbers of pairs of electrode fingers satisfy $Na/Ni \leq 0.312$.

8. The surface acoustic wave resonator according to claim 7, wherein the numbers of pairs of electrode fingers satisfy $0.111 \leq Na/Ni \leq 0.285$.

9. The surface acoustic wave resonator according to claim 7, wherein a pair of reflectors is provided so as to sandwich the interdigital transducer along the direction in which the surface acoustic waves propagate, and
wherein when the number of pairs of electrode fingers in the reflector disposed on one side of the interdigital transducer is Nr1 and the number of pairs of electrode fingers in the reflector disposed on the other side of the interdigital transducer is Nr2, the numbers of pairs of electrode fingers satisfy $Na/(Ni+Nr1+Nr2) \leq 0.24$.

10. The surface acoustic wave resonator according to claim 9, wherein the numbers of pairs of electrode fingers satisfy $0.088 \leq Na/(Ni+Nr1+Nr2) \leq 0.219$.

11. The surface acoustic wave resonator according to claim 1, wherein a value obtained by dividing the width of each electrode finger by an electrode finger pitch which is the distance between the centers of the neighboring electrode fingers is defined as a line occupying ratio,
wherein the line occupying ratio in the first region is fixed,
wherein the line occupying ratio in the second region is set to be greater than the line occupying ratio in the first region and to gradually increase from a part adjacent to the first region to the edge of the second region,
wherein the line occupying ratio in the third region is set to be greater than the line occupying ratio in the first region and to gradually increase from a part adjacent to the first region to the edge of the third region, and
wherein when the line occupying ratio in the first region is $\eta a$, the line occupying ratio at the edge of the second region is $\eta b_M$, and the line occupying ratio at the edge of the third region is $\eta c_N$, the variations in line occupying ratio at the edges are in the ranges of $1.15 < \eta b_M/\eta a < 1.70$ and $1.15 < \eta c_N/\eta a < 1.70$, respectively.

12. The surface acoustic wave resonator according to claim 11, wherein when the line occupying ratio at a position in the second region is $\eta b_m$, the line occupying ratio at a position adjacent thereto is $\eta b_{m+1}$, the line occupying ratio at a position in the third region is $\eta c_n$, and the line occupying ratio at a position adjacent thereto is $\eta c_{n+1}$, the variations in line occupying ratio at neighboring positions are in the ranges of $0.00180 < |\eta b_{m+1} - \eta b_m|/\eta b_m < 0.00885$ and $0.0018 < |\eta c_{n+1} - \eta c_n|/\eta c_n < 0.00885$, respectively.

13. A surface acoustic wave oscillator in which the surface acoustic wave resonator according to claim 1 and a circuit element are mounted on a package.

14. A surface acoustic wave module unit in which the surface acoustic wave resonator according to claim 1 is mounted on a circuit board.

* * * * *